United States Patent
Kwon

(10) Patent No.: US 9,153,704 B2
(45) Date of Patent: Oct. 6, 2015

(54) NONVOLATILE MEMORY DEVICE AND METHOD FOR FABRICATING THE SAME

(71) Applicant: SK hynix Inc., Icheon-si (KR)

(72) Inventor: Young-Jun Kwon, Icheon-si (KR)

(73) Assignee: SK HYNIX INC., Icheon (KR)

( * ) Notice: Subject to any disclaimer, the term of this patent is extended or adjusted under 35 U.S.C. 154(b) by 92 days.

(21) Appl. No.: 13/870,809

(22) Filed: Apr. 25, 2013

(65) Prior Publication Data

US 2014/0175533 A1    Jun. 26, 2014

(30) Foreign Application Priority Data

Dec. 26, 2012 (KR) ........................ 10-2012-0153037

(51) Int. Cl.
| | | |
|---|---|---|
| *H01L 29/788* | (2006.01) | |
| *G01C 11/34* | (2006.01) | |
| *H01L 29/792* | (2006.01) | |
| *H01L 21/28* | (2006.01) | |
| *H01L 29/66* | (2006.01) | |
| *H01L 29/423* | (2006.01) | |
| *H01L 27/115* | (2006.01) | |

(52) U.S. Cl.
CPC ........ *H01L 29/792* (2013.01); *H01L 21/28282* (2013.01); *H01L 29/42344* (2013.01); *H01L 29/66833* (2013.01); *H01L 27/1157* (2013.01)

(58) Field of Classification Search
CPC ............ H01L 29/792; H01L 29/42344; H01L 29/66833; H01L 27/1157; H01L 21/28282
USPC .......... 257/314, 315, 316, 321, 324, E29.129, 257/E27.081, E27.103, E21.196, E21.422, 257/E21.679, E21.682; 438/201, 211, 266, 438/267, 283
See application file for complete search history.

(56) References Cited

U.S. PATENT DOCUMENTS

| | | | |
|---|---|---|---|
| 7,037,787 B2 * | 5/2006 | Fan et al. | 438/267 |
| 8,110,461 B2 | 2/2012 | Kwon | |
| 2008/0266981 A1 * | 10/2008 | Koh et al. | 365/185.28 |

FOREIGN PATENT DOCUMENTS

| | | |
|---|---|---|
| KR | 10-2010-0080240 A | 7/2010 |
| KR | 10-2010-0080244 A | 7/2010 |

* cited by examiner

*Primary Examiner* — Dao H Nguyen

(57) ABSTRACT

A nonvolatile memory device includes a memory gate including a memory layer provided over a substrate and a gate electrode provided over the memory layer, the memory gate having first and second opposing sidewalls disposed on first and second sides of the memory gate, respectively; first and second select gates disposed on the first and second sidewalls of the memory gate; a source region formed in the substrate proximate to the first side of the memory gate; a drain region formed in the substrate proximate to the second side of the memory gate; and a gate contact coupled to the gate electrode of the memory gate and to the first select gate, or the second select gate, or both.

20 Claims, 23 Drawing Sheets

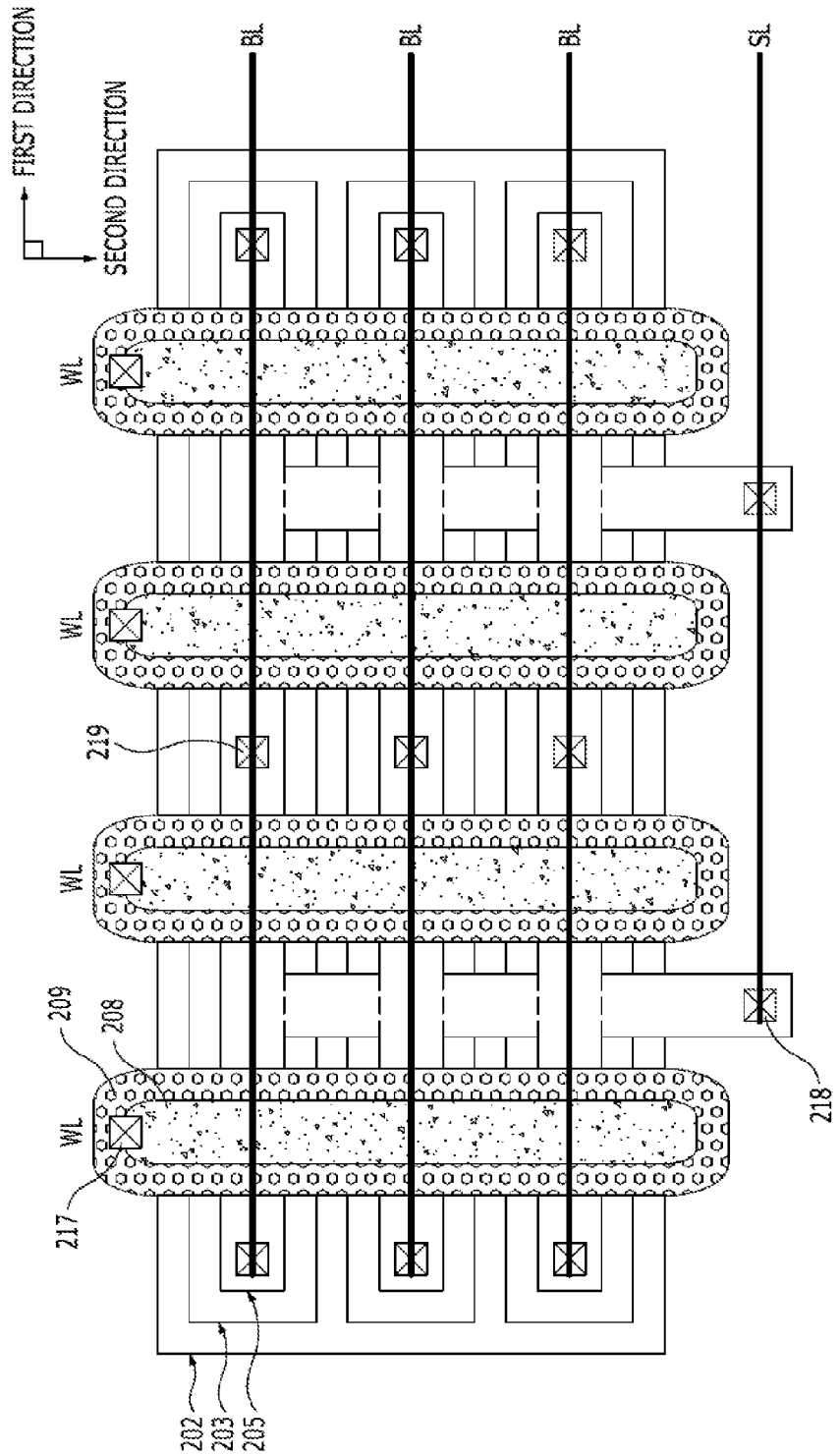

NONVOLATILE MEMORY DEVICE AND METHOD FOR FABRICATING THE SAME

CROSS-REFERENCE TO RELATED APPLICATION

The present application claims priority to Korean Patent Application No. 10-2012-0153037, filed on Dec. 26, 2012, which is incorporated herein by reference in its entirety.

BACKGROUND

1. Field

Embodiments relate to a semiconductor device fabrication technology, and more particularly, to a nonvolatile memory device and a method for fabricating the same.

2. Description of the Related Art

A life environment is being changed such that anyone can conveniently use desired information anytime and anywhere, thanks to recently developed digital media devices. A variety of rapidly spreading digital devices require storage media capable of conveniently storing captured images, recorded music and various data. In order to meet this requirement, there is a growing interest in the field of a system-on-chip (SoC) according to a trend towards a high degree of integration of non-memory semiconductors, and semiconductor manufacturers compete to invest in the field of SoC in an effort to strengthen SoC-based technology. A SoC refers to system technologies that are integrated in one semiconductor. If a system design technology is not secured, it may be difficult to develop non-memory semiconductors.

A type of SoC where complicated technologies are integrated, is an embedded memory. A memory which is highlighted among embedded memories is a flash memory. Flash memory may be divided into a NOR type and a NAND type. A NOR type flash memory is mainly used in embedded memories. Also, a flash memory may be divided into a floating gate type and a silicon-oxide-nitride-oxide-silicon (SONOS) type. Recently, research has been actively conducted for the SONOS type.

FIG. 1 is a cross-sectional view illustrating a conventional nonvolatile memory device.

Describing a conventional SONOS type flash memory device with reference to FIG. 1, a memory gate (MG) in which a memory layer 105 and a gate electrode 106 are stacked is formed on a substrate 101, and spacers 107 are formed on both sidewalls of the memory gate MG. Source/drain regions 108 are formed in the substrate 101 on both sides of the memory gate MG. The memory layer 105 is an oxide-nitride-oxide (ONO) layer in which a first oxide layer 102, a nitride layer 103 and a second oxide layer 104 are sequentially stacked. The gate electrode 106 serves as a control gate.

In the flash memory device having the above structure, a problem may be caused in that over-erase is likely to occur in an erase operation. In order to solve this problem, an additional operation such as recovery is used, and due to this fact, the size of a peripheral circuit may increase.

Further, while the conventional flash memory device uses a hot carrier injection (HCI) scheme for a program operation, since the HCI scheme consumes a large amount of current for programming, the HCI scheme is inappropriate for an embedded memory.

SUMMARY

Various embodiments are directed to a nonvolatile memory device which can prevent over-erase, and a method for fabricating the same.

Also, various embodiments are directed to a nonvolatile memory device which can reduce current consumption, and a method for fabricating the same.

In an embodiment, a nonvolatile memory device includes a memory gate including a memory layer provided over a substrate and a gate electrode provided over the memory layer, the memory gate having first and second opposing sidewalls disposed on first and second sides of the memory gate, respectively; first and second select gates disposed on the first and second sidewalls of the memory gate; a source region formed in the substrate proximate to the first side of the memory gate; a drain region formed in the substrate proximate to the second side of the memory gate; and a gate contact coupled to the gate electrode of the memory gate and to the first select gate, or the second select gate, or both.

In an embodiment, a nonvolatile memory device includes a substrate having a plurality of active regions, the active regions extending along a first direction; a plurality of memory gates, each including a memory layer and a gate electrode which are stacked over the substrate; a plurality of select gates, each formed on at least two opposing sidewalls of one of the memory gates; a plurality of gate contacts, each coupling one of the gate electrodes with corresponding the select gates; a plurality of word lines, each extending along a second direction different from the first direction; a plurality of source regions, each formed in the substrate proximate to a first side of the memory gates; a plurality of drain regions, each formed in the substrate proximate to a second side of the memory gates; a plurality of bit lines extending along the first direction, each of the bit lines being connected to one of the drain regions; and a plurality of source lines, each of the source lines being connected to one of the source regions.

In an embodiment, a nonvolatile memory device includes a substrate; a first well provided in the substrate; and a plurality of memory cells provided on the first well, each memory cell includes a memory gate including a memory layer and a gate electrode provided over the memory layer, the memory gate having first and second opposing sidewalls; first and second select gates disposed on the first and second sidewalls of the memory gate; a source region formed in the substrate proximate to the first side of the memory gate; and a drain region formed in the substrate proximate to the second side of the memory gate.

In an embodiment, a method for fabricating a nonvolatile memory device includes forming a memory gate having a memory layer provided over a substrate and a gate electrode provided over the memory layer; forming first and second select gates over first and second sidewalls of the memory gate, respectively; forming a source region in the substrate proximate to first sidewall of the memory gate; forming a drain region in the substrate proximate to the second sidewall of the memory gate; forming an interlayer dielectric layer over the substrate to cover the memory gate; and forming a gate contact extending through the interlayer dielectric layer, the gate contact being coupled to the gate electrode of the memory gate and to the first select gate, or the second select gate, or both. The forming of the memory gate may include forming the memory layer including a tunnel dielectric layer, a charge trap layer and a charge blocking layer, the charge trap layer provided between the tunnel dielectric layer and the charge blocking layer; forming a gate conductive layer over the memory layer; and selectively etching the gate conductive layer and the memory layer. The forming of the first and the second select gates may include forming a gate dielectric layer over the memory gate; forming a gate conductive layer over the gate dielectric layer; and etching the gate conductive layer and the gate dielectric layer using a blanket etching process. The blanket etching process may include an etchback process. The first and second select gates may be joined to each other at least one end. The forming of the gate contact may include selectively etching the interlayer dielectric layer to form a contact hole exposing at least one of the first and the second select gates and the gate electrode; and filling the contact hole with conductive material. The contact hole may be a hole type which exposes and a single portion of the gate electrode, or a bar type or a line type which exposes two portions of the gate electrode.

In an embodiment, a method for fabricating a nonvolatile memory device includes forming a first pattern over a substrate, the first pattern having a memory layer and a sacrificial layer; forming first and second select gates on first and second sidewalls of the first pattern, respectively; forming a source region in the substrate proximate to the first sidewall of the first pattern; forming a drain region in the substrate proximate to the second sidewall of the first pattern; forming an interlayer dielectric layer over the substrate to cover the first and second select gates and the first pattern; selectively etching the interlayer dielectric layer to form a opening which exposes the sacrificial layer and the first select gate or the second select gate or both; removing the sacrificial layer; enlarging the opening; and filling the opening with conductive material, the conductive material being used to form a gate electrode and a gate contact. The forming of the first pattern may includes: forming the memory layer over the substrate, the memory layer including a tunnel dielectric layer, a charge trap layer and a charge blocking layer; forming the sacrificial layer over the memory layer, the sacrificial layer having an etch selectivity with respect to the interlayer dielectric layer; and selectively etching the sacrificial layer and the memory layer. The forming of the first and the second select gates may include: forming a gate dielectric layer over the first pattern; forming a gate conductive layer over the gate dielectric layer; and etching the gate conductive layer and the gate dielectric layer using a blanket etching process. The blanket etching process may include an etch-back process. The first and the second select gates may be joined to each other at least one end. The opening may be a hole type, a bar type, or a line type, and the opening may expose the sacrificial layer and the first and the second select gates. The sacrificial layer may be removed through wet etching.

BRIEF DESCRIPTION OF THE DRAWINGS

FIGS. 8A and 8B are plan views illustrating cell arrays of the nonvolatile memory device in accordance with embodiments.

DETAILED DESCRIPTION

Figure 1:
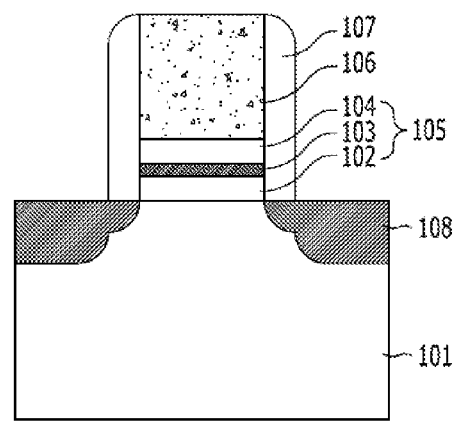
FIG. 1 is a cross-sectional view illustrating a conventional nonvolatile memory device.

Various embodiments will be described below in more detail with reference to the accompanying drawings. Embodiments, however, may be implemented in different forms and should not be construed as limited to those specifically set forth herein. Throughout the disclosure, like reference numerals refer to like parts throughout the various figures and embodiments.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

Embodiments which will be described below provide a nonvolatile memory device which is applicable to an embedded memory, and a method for fabricating the same. In detail, embodiments relate to a flash memory in an embedded system, and more particularly, to a nonvolatile memory device which can prevent over-erase and excessive current consumption in a silicon-oxide-nitride-oxide-silicon (SONOS) type flash memory device, and a method for fabricating the same. For reference, the SONOS type flash memory device is a nonvolatile memory device which uses a mechanism for trapping or ejecting charge carrier into or out of trap sites in a floating gate.

To this end, embodiments provide a nonvolatile memory device which has a select gate capable of preventing overerase and can perform a program operation and an erase operation in a Fowler-Nordheim (FN) tunneling scheme capable of significantly reducing current consumption when compared to a hot carrier injection (HCI) scheme, and a method for fabricating the same. There are two common categories of conventional nonvolatile memory devices with a select gate. The first is a dual gate type nonvolatile memory device in which a select gate is disposed on one side of a memory gate (or a floating gate) parallel to the memory gate and separated by a predetermined distance. The second is a split gate type nonvolatile memory device in which a select gate is disposed adjacent to one sidewall of a memory gate (or a floating gate). Although over-erase may be prevented by the select gate in these devices, because the select gate is formed only on one side of the memory gate, cell uniformity is compromised, and the characteristics of the nonvolatile memory device are likely to be degraded due to variation in the channel length of the select gate and a charge trap mismatch (or mismatch between charge states of various charge traps in a single device). Thus, embodiments provide a nonvolatile memory device which has a select gate capable of preventing over-erase, and can prevent degradation of the characteristics of a nonvolatile memory device due to a variation in the channel length of a select gate and a charge trap mismatch.

In the following descriptions, a first conductivity type and a second conductivity type refer to complementary conductivity types. Namely, if the first conductivity type is a P type, the second conductivity type is an N type, and, if the first conductivity type is an N type, the second conductivity type is a P type. This indicates that a nonvolatile memory device in accordance with embodiments may be an N-channel type or a P-channel type.

Figure 2A:
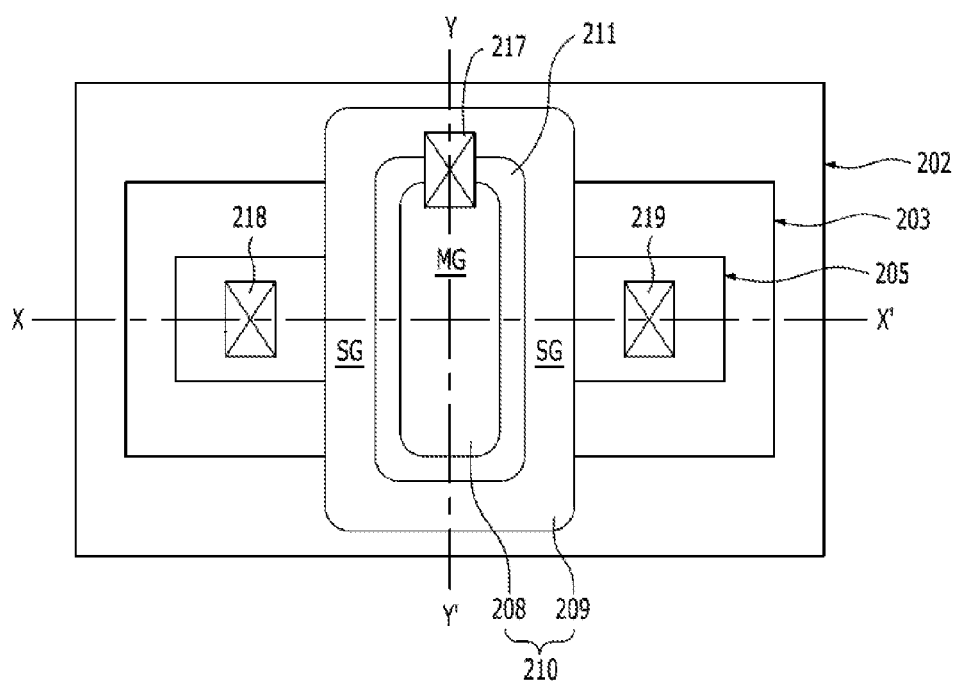
FIGS. 2A to 2C are views illustrating a nonvolatile memory device in accordance with a first embodiment.
Figure 2B:
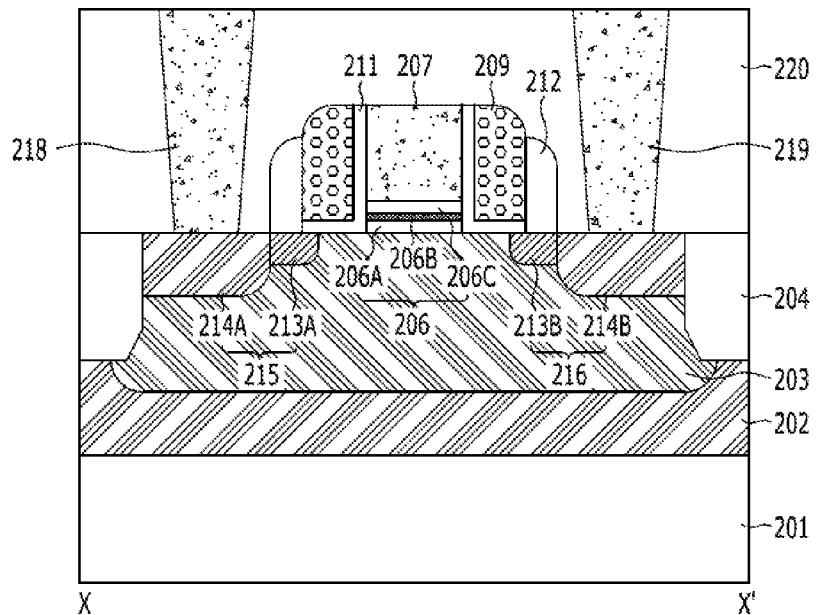
Figure 2C:
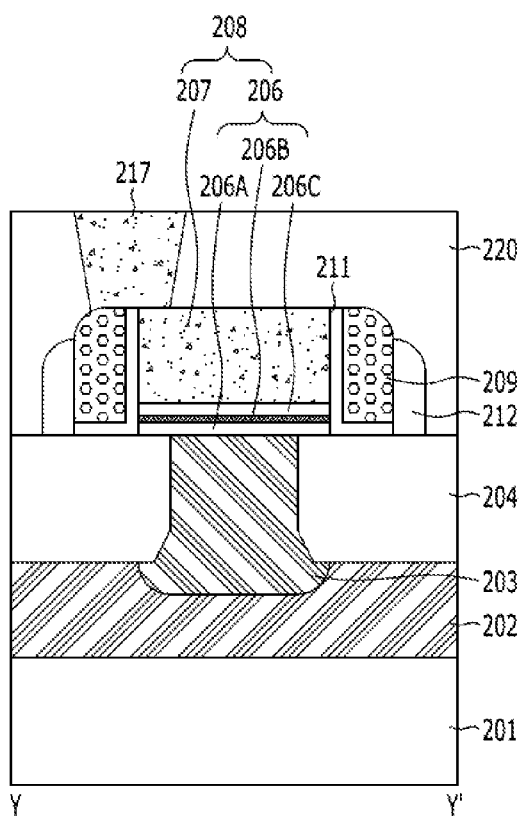

FIGS. 2A to 2C are views illustrating a nonvolatile memory device in accordance with a first embodiment. In detail, each of FIGS. 2A to 2C illustrates a unit cell of the nonvolatile memory device, wherein FIG. 2A is a plan view and FIGS. 2B and 2C are cross-sectional views taken along the lines X-X' and Y-Y' of FIG. 2A.

Referring to FIGS. 2A to 2C, a nonvolatile memory device in accordance with a first embodiment includes a memory gate (MG) 208 in which a memory layer 206 and a gate electrode 207 are stacked on a substrate 201, a select gate (SG) 209 which is formed on sidewalls of the memory gate 208, a source region 215 and a drain region 216 which are formed in the substrate 201 on sides of a gate pattern 210 including the memory gate 208 and the select gate 209, and a gate contact 217 which electrically connects the memory gate 208 to the select gate 209.

A deep well 202 of the second conductivity type and an isolated well (or isolation well) 203 of the first conductivity type (or P type) are formed in the substrate 201. The substrate 201 may be a semiconductor substrate. The semiconductor substrate may be in a single crystalline state, and may include silicon. In an embodiment, the semiconductor substrate may include a monocrystalline silicon layer. For instance, the substrate 201 may be a bulk silicon substrate, or a silicon-on-insulator (SOI) substrate in which a supporting substrate, a buried dielectric layer and a monocrystalline silicon layer are sequentially stacked.

The deep well 202 and the isolated well 203 which are formed in the substrate 201 may be impurity regions which are formed by ion-implanting impurities (or dopants) of the second conductivity type (or N type) and impurities of the first conductivity type (or P type), respectively, and provide a base on which a unit cell may operate. In an operation, bias (for example, a voltage) may be applied to the deep well 202 and the isolated well 203. Due to the bias applied to the deep well 202 and the isolated well 203, the magnitude of the bias applied to the gate pattern 210 during device operation may be reduced since the movement of charge carriers are based on the potential difference two nodes. Additionally, the deep well 202 defines a region wherein a plurality of isolated wells 203 may be defined, and each isolated well 203 defines a smaller region wherein one or more memory cells may be defined. These two wells 202 and 203 are used to separately control the operation of the memory cells provided in different isolation/deep wells. See FIG. 8A. The wells also serve to decrease the interference effects of memory cells provided in adjacent wells.

An isolation structure 204 is formed in the substrate 201 in such a way as to define an active region 205. The active region 205 may be a bar type or a line type which has a major axis and a minor axis. The active region 205 may include a projection (not shown) which is formed at the end of the active region 205 in the direction of the major axis. The isolation structure 204 may be formed through a shallow trench isolation (STI) process. The isolation structure 204 includes dielectric material to electrically isolate a given region. With respect to the substrate 201, a bottom surface of the isolation structure 204 may be located at a higher level than a bottom surface of the isolated well 203. In another embodiment, the bottom surface of the isolation structure 204 may be positioned between the bottom surface of the isolated well 203 and a bottom surface of the deep well 202.

The memory gate 208 in which the memory layer 206 and the gate electrode 207 are stacked, is formed on the substrate 201. The memory layer 206 may be a stack layer in which a tunnel dielectric layer 206A, a charge trap layer 206B and a charge blocking layer 206C are sequentially stacked. Each of the tunnel dielectric layer 206A, the charge trap layer 206B and the charge blocking layer 206C may include an oxide layer, a nitride layer, an oxynitride layer, or a stack layer including a combination of these layers. For instance, in an embodiment, each of the tunnel dielectric layer 206A and the charge blocking layer 206C may be an oxide layer, and the charge trap layer 206B may be a nitride layer. In other words, the memory layer 206 may have an oxide-nitride-oxide (ONO) structure. The gate electrode 207 on the memory layer 206 serves as a control gate, and controls trapping or ejecting of charge carriers (i.e., electrons or holes) to and from the charge trap layer 206B of the memory layer 206. The gate electrode 207 may include conductive material including silicon or metal, but embodiments are not limited thereto.

The select gate 209 is formed on sidewalls of the memory gate 208. The select gate 209 functions to prevent over-erase. In order to prevent the characteristics of the nonvolatile memory device from being degraded due to a variation in a channel length and a charge trap mismatch, the select gate 209 may have a shape which is formed on sidewalls of the memory gate 208. In detail, when viewed from above, the select gate 209 may have a shape which is formed on all sidewalls of the memory gate 208 and thus completely surrounds the outer perimeter of the memory gate 208. When viewed from a cross-sectional perspective such as the view of FIG. 2B, the select gate 209 may have a structure which is formed on first and second sidewalls of the memory gate 208 like spacers. For example, a first component of the select gate 209 is provided proximate to a first sidewall (e.g., the left sidewall when viewed from the perspective of FIG. 2A) of the memory gate 208 and a second component that is provided proximate to the second sidewall (e.g., the right sidewall when viewed from the perspective of FIG. 2A) of the memory gate. The select gate 209 may include conductive material including silicon or metal, or both.

In an embodiment of FIGS. 2A-2C, since the select gate 209 has the shape which surrounds the memory gate 208 when viewed from above such as the view of FIG. 2A, cell uniformity may be improved.

Although the select gate 209 is illustrated as a unitary structure that completely wraps around the outer perimeter of the memory gate 208, as shown in FIGS. 2A-2C, the select gate 209 may have different configurations according to implementation. For example, the select gate 209 may include first and second components that are physically connected to each other only at one end (e.g., where the gate contact 217 is provided) and is opened at the other end. Alternatively, the select gate 209 may include first and second components that are not physically connected to each other at all and thus uses two gate contacts 217 to provide control signals to the first and second components of the select gate 209.

A gate dielectric layer 211 is provided between the select gate 209 and the substrate 201 and between the select gate 209 and the memory gate 208. As seen in FIG. 2B and FIG. 2C, the gate dielectric layer 211 may have an 'L' shaped cross-section. For example, the gate dielectric layer 211 includes a lateral portion that is provided between the isolated well 203 and the select gate 209, and a vertical portion that is provided between the memory gate 208 and the select gate 209. The vertical portion is provided on sidewalls of the memory layer 206 and the gate electrode 207. In an embodiment, the thickness of the lateral portion of gate dielectric layer 211 provided between the select gate 209 and the isolated well 203 (or the substrate 201) is the same as or larger than the thickness of the vertical portion of gate dielectric layer 211 provided between the select gate 209 and the memory gate 208. The gate dielectric layer 211 may include an oxide layer, a nitride layer, an oxynitride layer, or a stack layer thereof.

A spacer 212 is formed on sidewalls of a gate pattern 210 including the memory gate 208 and the select gate 209. In an embodiment, when viewed from above, the spacer 212 has a shape that wraps around the outer perimeter the gate pattern 210. For example, the spacer 212 is formed on the sidewalls of the select gate 209 that are distal from the memory gate 208. When viewed from a cross-sectional perspective such as the view of FIG. 2B, the spacer 212 has a structure that is formed on first and second sidewalls of the select gate 209 (or the gate pattern 210 since the select gate 209 defines the outer perimeter of the gate pattern 210 according to the embodiment of FIGS. 2A-2C). The spacer 212 may include an oxide layer, a nitride layer, an oxynitride layer, or a stack layer thereof.

The source region 215 and the drain region 216 of the second conductivity type are formed in the substrate 201 on first and second sides of the gate pattern 210 including the memory gate 208 and the select gate 209. The source region 215 and the drain region 216 may be impurity regions that are formed by implanting impurities of the second conductivity type into the substrate 201, and may have lightly doped drain (LDD) structures (e.g., impurity regions 213A and 213B). In detail, the source region 215 and the drain region 216 may include first impurity regions 213A and 213B of the second conductivity type and second impurity regions 214A and 214B of the second conductivity type. The impurity doping concentration of the second impurity regions 214A and 214B may be greater than the impurity doping concentration of the first impurity regions 213A and 213B. Portions of the first impurity regions 213A and 213B may overlap with portions of the select gate 209, and the interface of the first impurity regions 213A and 213B and the second impurity regions 214A and 214B may be aligned with the outer perimeter of the spacer 212.

An interlayer dielectric layer 220 is formed over, e.g., the entire surface of the substrate 201 to cover the gate pattern 210. The gate contact 217, a source contact 218 and a drain contact 219 pass through the interlayer dielectric layer 220 and are connected, respectively, with the gate pattern 210, the source region 215 and the drain region 216. The interlayer dielectric layer 220 may include an oxide layer, a nitride layer, an oxynitride layer, or a stack layer thereof.

The gate contact 217 may be a plug, i.e., a structure that is formed by filling a via that exposes the gate electrode 207 of the memory gate 208 and the select gate 209. Alternatively, the gate contact 217 may be a bar type or a line type which contacts the gate electrode 207 of the memory gate 208 and the select gate 209 on two or more sides of the gate electrode 207. In an embodiment, the memory gate 208 and the select gate 209 are electrically connected to each other by the gate contact 217.

The gate contact 217 performs a function of connecting a conductive line (not shown) on the interlayer dielectric layer 220, for example, a word line, to the gate pattern 210. The bias applied through the word line may be simultaneously applied to the memory gate 208 and the select gate 209. The source contact 218 performs a function of connecting a conductive line (not shown) on the interlayer dielectric layer 220, for example, a source line, to the source region 215. The drain contact 219 performs a function of connecting a conductive line (not shown) on the interlayer dielectric layer 220, for example, a bit line, to the drain region 216.

Although not shown in the drawings, in an embodiment, an ohmic contact layer is formed on the surface of the memory gate 208, the surface of the select gate 209, the surface of the source region 215 and the surface of the drain region 216. The ohmic contact layer reduces contact resistance, and may include a metal silicide.

Since a nonvolatile memory device with the above-described structure has the select gate 209, over-erase may be prevented and thus the need for a recovery operation and a peripheral circuit therefor may be eliminated. That is to say, by preventing the over-erase, it is possible to improve the operation characteristics and the degree of integration of a nonvolatile memory device.

Also, in a nonvolatile memory device with the above-described structure, when the memory gate 208 and the select gate 209 are disposed on the isolated well 203 and the select gate 209 is disposed on sides of the memory gate 208, a Fowler-Nordheim (FN) tunneling scheme may be used in a program operation and an erase operation. In other words, problems caused in the conventional art due to the use of a hot carrier injection (HCI) scheme, such as excessive power consumption, may be prevented.

Further, in a nonvolatile memory device with the above-described structure, when the select gate 209 is disposed on sides of the memory gate 208, it is possible to prevent the characteristics of a nonvolatile memory device from being degraded due to a variation in the channel length of a select gate and a charge trap mismatch.

Moreover, in a nonvolatile memory device with the above-described structure, since the select gate 209 is disposed on sides of the memory gate 208 and has a shape which surrounds (or substantially surrounds) the memory gate 208 when viewed from above, it is possible to improve cell uniformity.

FIGS. 3A to 3G and 4A to 4G are views explaining an exemplary method for fabricating a nonvolatile memory device in accordance with the first embodiment of the present invention. In detail, FIGS. 3A to 3G and 4A to 4G are cross-sectional views taken along the lines X-X' and Y-Y' of FIG. 2A, explaining the processes of the method for fabricating the nonvolatile memory device.

Figure 3A:
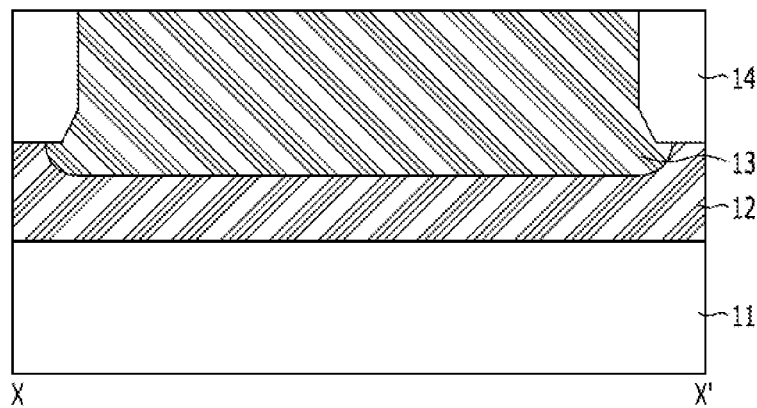
FIGS. 3A to 3G and 4A to 4G are views explaining an exemplary method for fabricating the nonvolatile memory device in accordance with the first embodiment.
Figure 4A:
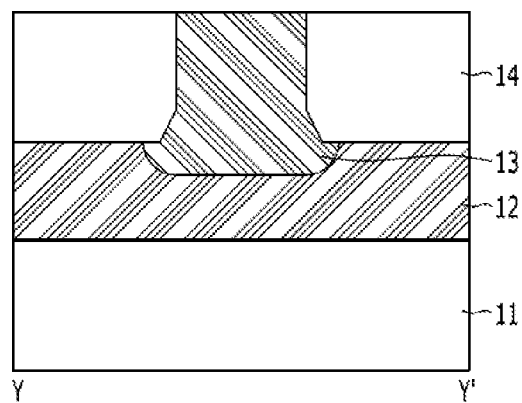

Referring to FIGS. 3A and 4A, a deep well 12 of the second conductivity type is formed in a substrate 11. A bulk silicon substrate or an SOI substrate may be used for the substrate 11. The deep well 12 may be formed by implanting impurities of the second conductivity type (for example, N type impurities) into the substrate 11.

An isolation structure 14 is formed in the substrate 11 to define a plurality of active regions in the deep well 12. The isolation structure 14 may be formed through a shallow trench isolation (STI) process. The STI process refers to a series of processes of defining trenches for isolation in the substrate 11 and filling dielectric material in the trenches, thereby forming an isolation structure. Each of the active regions defined by the isolation structure 14 may be a bar type or a line type which have a major axis and a minor axis. Each of the active regions defined by the isolation structure 14 may include a projection (not shown) which is formed at the end of the active region.

An isolated well 13 (or a shallow well) of the first conductivity type is formed in the substrate 11. The isolated well 13 is formed within the deep well 12 in an embodiment. The isolated well 13 may be formed such that the bottom surface of the isolated well 13 is at a depth between the bottom surface of the isolation structure 14 and the bottom surface of the deep well 12. A plurality of isolated wells 13 may be formed in the deep well 12. Each of the isolated wells 13 may be isolated by the isolation structure 14 and junction isolation between the isolated well 13 and the deep well 12. The isolated well 13 may be formed by implanting impurities of the first conductivity type (for example, P type impurities) into the deep well 12.

Figure 3B:
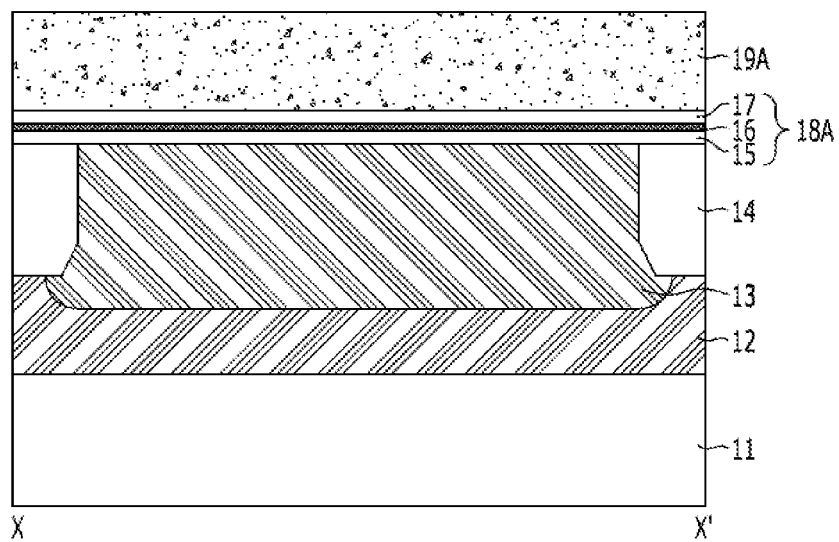
Figure 4B:
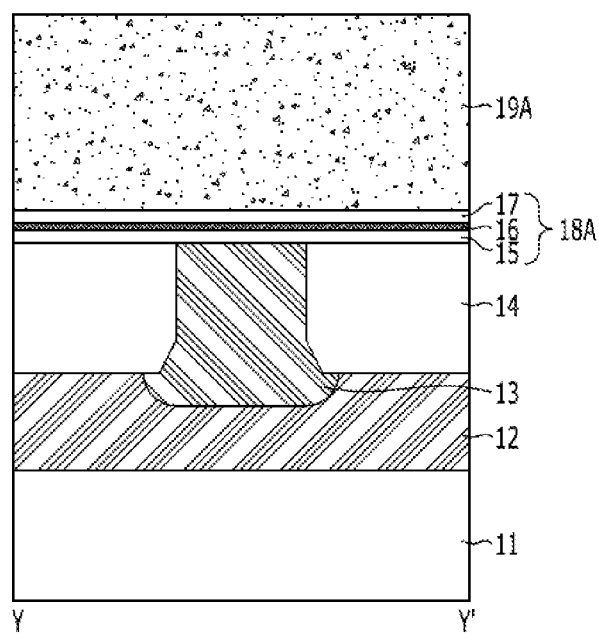

Referring to FIGS. 3B and 4B, a memory layer 18A is formed on the surface of the substrate 11. The memory layer 18A includes a tunnel dielectric layer 15 over the isolated well 13, a charge trap layer 16 over the tunnel dielectric layer 15, and a charge blocking layer 17 over the charge trap layer 16. Each of the tunnel dielectric layer 15, the charge trap layer 16 and the charge blocking layer 17 may be formed as a dielectric layer and may include an oxide layer, a nitride layer, or an oxynitride layer, or a combination thereof. The memory layer 18A has an oxide-nitride-oxide (ONO) structure in an embodiment, but may have a different structure according to implementation.

In detail, the tunnel dielectric layer 15 may be formed of an oxide layer such as a silicon oxide layer. The silicon oxide layer may be formed through thermal oxidation. The charge trap layer 16 may be formed of a nitride layer such as a silicon nitride layer. The charge trap layer 16 may be formed through chemical vapor deposition (CVD) or atomic layer deposition (ALD). The charge blocking layer 17 may be formed of an oxide layer such as a metal oxide layer with a higher dielectric constant than a silicon oxide layer. The charge blocking layer 17 may be formed through CVD.

A first gate conductive layer 19A is formed on the memory layer 18A. The first gate conductive layer 19A may be formed using silicon-containing material. For example, in an embodiment, the first gate conductive layer 19A may include polysilicon.

Figure 3C:
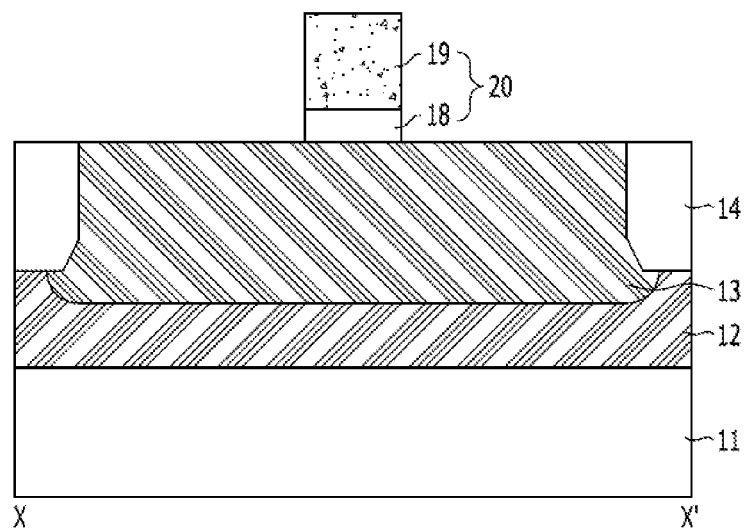
Figure 4C:
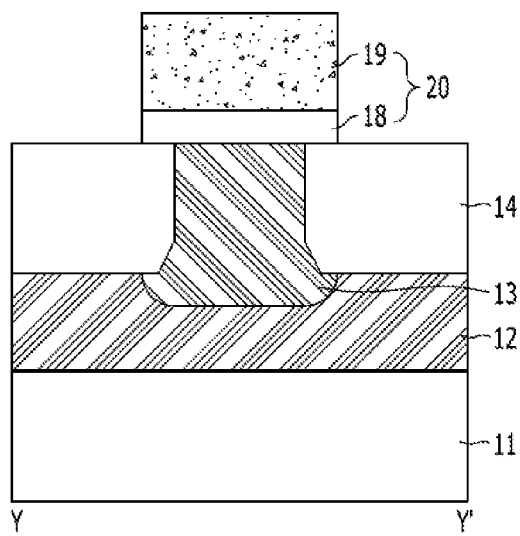

Referring to FIGS. 3C and 4C, after forming mask patterns (not shown) on the first gate conductive layer 19A, the first gate conductive layer 19A and the memory layer 18A are sequentially etched using the mask patterns as an etch mask. The etching may be performed as a dry etching process.

As a result, a memory gate 20 in which a memory layer 18 and a gate electrode 19 are stacked may be formed.

Figure 3D:
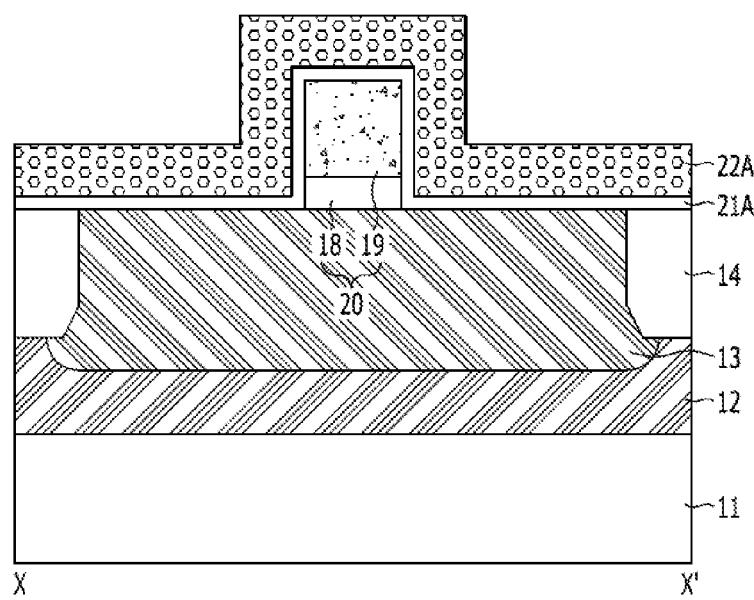
Figure 4D:
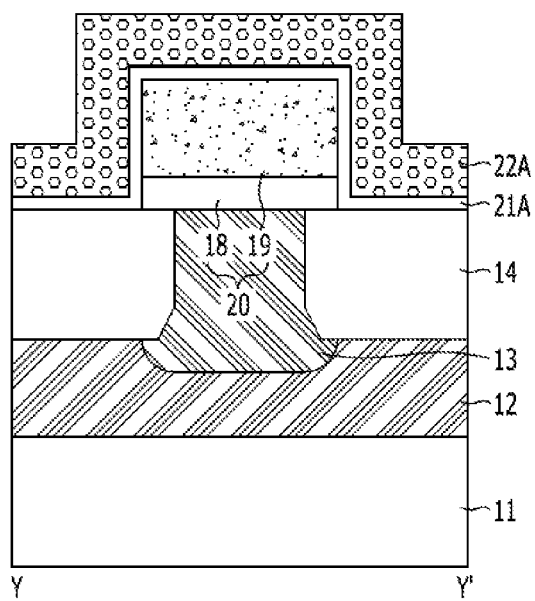

Referring to FIGS. 3D and 4D, a gate dielectric layer 21A is formed over the outer surface of a structure including the memory gate 20. The gate dielectric layer 21A may include oxide, nitride, or oxynitride, or a combination thereof. For instance, the gate dielectric layer 21A may be an oxide layer that is formed through an oxidation process or a deposition process. The oxidation process may include thermal oxidation, and the deposition process may include CVD, physical vapor deposition (PVD) or ALD.

A second gate conductive layer 22A is formed on the gate dielectric layer 21A. The second gate conductive layer 22A may include silicon-containing material. In an embodiment, the second gate conductive layer 22A may be formed using the same material as the gate electrode 19 of the memory gate 20. For instance, the second gate conductive layer 22A may be based on polysilicon. A thickness d of the second gate conductive layer 22A determines the channel length of a select gate which will be formed through a subsequent process. In an embodiment, the thickness is controlled to obtain the desired channel length for the select gate.

Figure 3E:
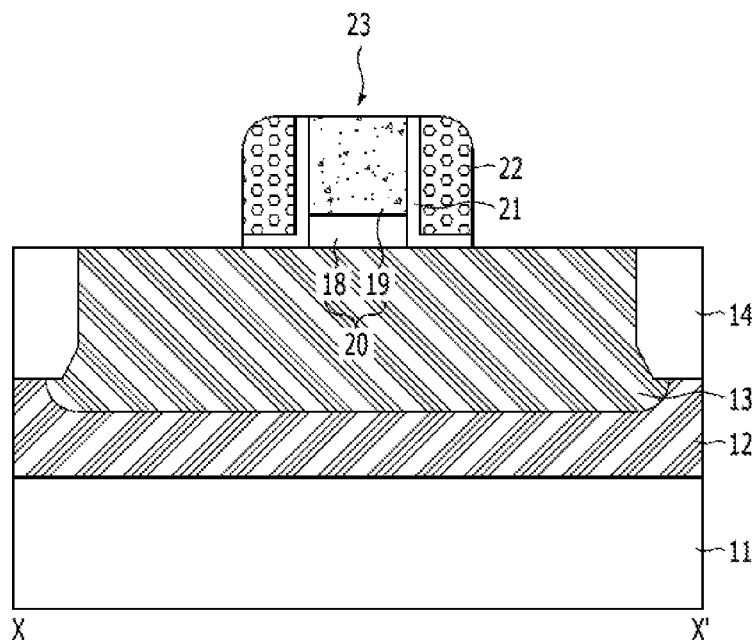
Figure 4E:
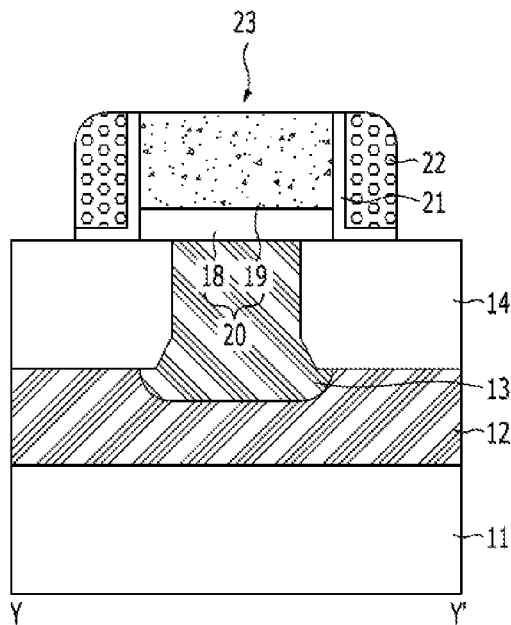

Referring to FIGS. 3E and 4E, a blanket etching process is performed on the second gate conductive layer 22A and the gate dielectric layer 21A, to form a select gate 22. The blanket etching process may be performed as an etch-back process. A gate dielectric layer 21 may be provided between the select gate 22 and the memory gate 20 and between the select gate 22 and the substrate 11 (or the isolated well 13). As seen in FIG. 3E, the select gate 22 is formed on sidewalls of the memory gate 20 and may have a spacer shape. When compared to a patterning process using photolithography and etching, because the select gate 22 is formed through the blanket etching process, the thickness of the select gate 22 is more uniform. Examples of blanket etching process includes an etch back process and other etching processes that do not use etch mask to perform the etching. As a result, variation in the channel length of the select gate 22 may be decreased, so that cell uniformity may be improved.

As a result of the blanket etching process, a gate pattern 23 is formed by forming the blanket etching process. The gate pattern 23 includes the memory gate 20 and the select gate 22 formed on sidewalls of the memory gate 20. The gate dielectric 21 is provided on the sidewall of the memory gate 20 and separates the memory gate 20 from the select gate 22.

Figure 3F:
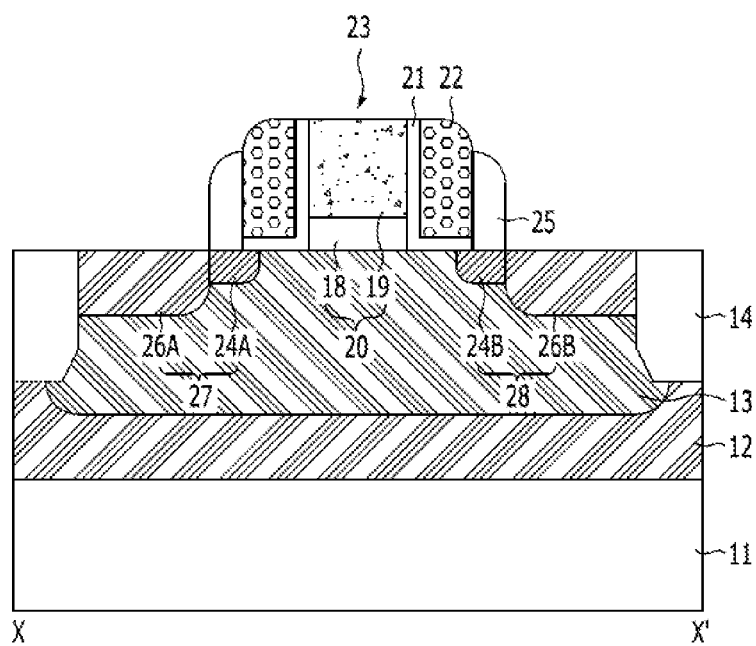
Figure 4F:
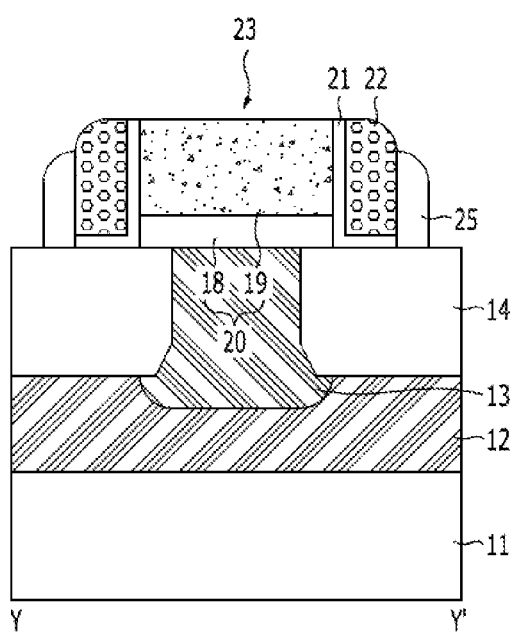

Referring to FIGS. 3F and 4F, first impurity regions 24A and 24B of the second conductivity type are formed in the substrate 11 on first and second sides of the gate pattern 23. The first impurity regions 24A and 24B may be formed by implanting impurities of the second conductivity type into the substrate 11 on the first and second sides of the gate pattern 23.

A spacer 25 is formed on sidewalls of the gate pattern 23. In other words, the spacer 25 is formed on the sidewalls of the select gate 22. The spacer 25 may include oxide, nitride, or oxynitride, or a combination thereof. The spacer 25 may be of a single layer or comprise a plurality of layers according to implementation.

Second impurity regions 26A and 26B of the second conductivity type are formed in the substrate 11 on sides of the gate pattern 23 including the spacer 25. The second impurity regions 26A and 26B may be formed by implanting impurities of the second conductivity type into the substrate 11, e.g., regions within the isolated well 13 that are defined by the spacer 25 and the isolation structure 14. In an embodiment, the second impurity regions 26A and 26B have an impurity doping concentration that is greater than that of the first impurity regions 24A and 24B.

A first set of impurity regions including the first and second impurity regions 24A and 26A defines a source region 27. A second set of impurity regions including the first and second impurity regions 24B and 24B defines a drain region 28. The first impurity regions 24A and 24B define LDD structures for the source region 27 and the drain region 28, respectively.

Figure 3G:
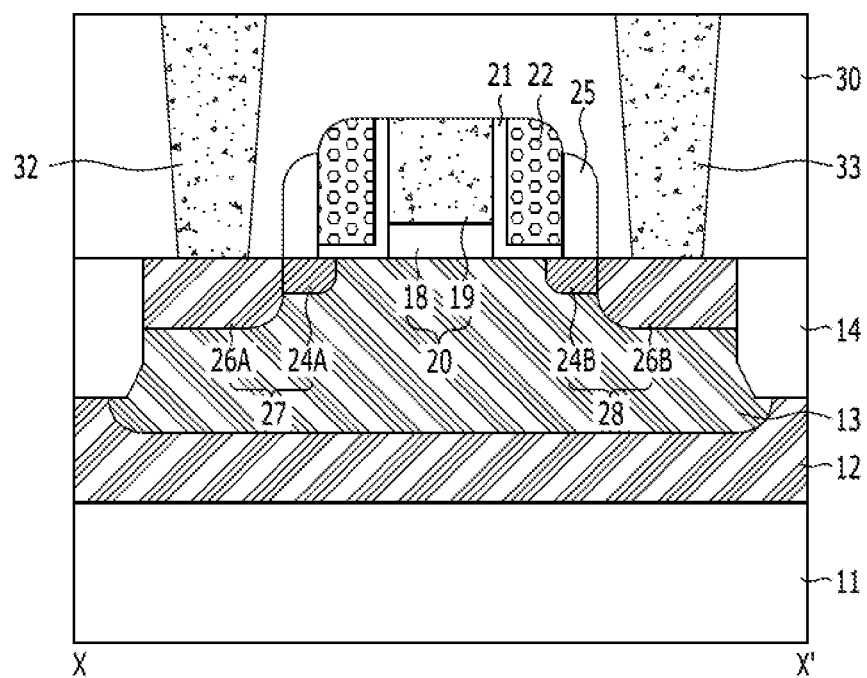
Figure 4G:
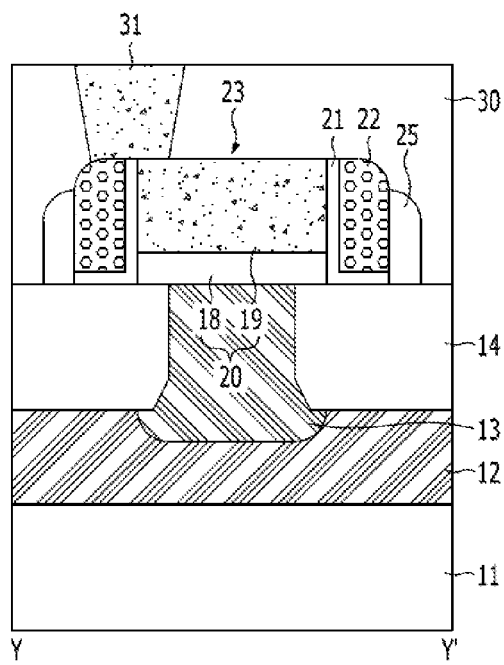

Referring to FIGS. 3G and 4G, an interlayer dielectric layer 30 is formed on the substrate 11 to cover the gate pattern 23. The interlayer dielectric layer 30 may include oxide, nitride and oxynitride, a combination thereof. The interlayer dielectric layer 30 may be of a single layer or comprise a plurality of layers according to implementation.

Although not shown in FIGS. 3G and 4G, an ohmic contact layer (not shown) may be formed on the surface of the memory gate 20, the surface of the select gate 22, the surface of the source region 27 and the surface of the drain region 28, before forming the interlayer dielectric layer 30. The ohmic contact layer may be formed using a metal silicide. The ohmic contact layer may be formed through a series of processes of forming a metal layer such as a cobalt layer or a titanium layer, on the surface of the substrate 11, and then sequentially performing annealing and cleaning to remove unreacted portions of the metal layer.

A gate contact 31, a source contact 32 and a drain contact 33 are formed through the interlayer dielectric layer 30 to respectively contact the gate pattern 23, the source region 27 and the drain region 28. The gate contact 31 is commonly coupled to the select gate 22 and the memory gate 20. That is to say, the gate contact 31 is formed such that the select gate 22 and the memory gate 20 are connected to each other by the gate contact 31. In detail, the gate contact 31 may be formed as a contact plug which is in contact with the gate electrode 19 of the memory gate 20 and the select gate 22, or a bar type or a line type which is in contact with the gate electrode 19 of the memory gate 20 and the select gate 22 on sides of the gate electrode 19.

Although not shown in the figures, a word line which contacts the gate contact 31, a source line which contacts the source contact 32, and a bit line which contacts the drain contact 33, are formed over the interlayer dielectric layer 30.

Since the nonvolatile memory device formed through the above-described processes has the select gate 22, over-erase may be prevented and the need for a recovery operation may be avoided, which would eliminate the need for a peripheral circuit for a recovery operation. As a result, by preventing over-erase, it is possible to improve operation characteristics and integrate the nonvolatile memory device more densely.

Also, in a nonvolatile memory device formed through the above-described processes, when the memory gate 20 and the select gate 22 are disposed on the isolated well 13 and the select gate 22 is disposed on sides of the memory gate 20, an FN tunneling scheme may be used to program and erase the device. Therefore, problems caused in the conventional art due to the use of an HCI scheme, such as excessive power consumption, may be prevented.

Further, in a nonvolatile memory device formed through the above-described processes, when the select gate 22 is formed at an outer perimeter of the memory gate 20 through the blanket etching process, it is possible to prevent characteristics of a nonvolatile memory device from being degraded due to a variation in the channel length of a select gate and a charge trap mismatch, and it is possible to improve cell uniformity.

Figure 5A:
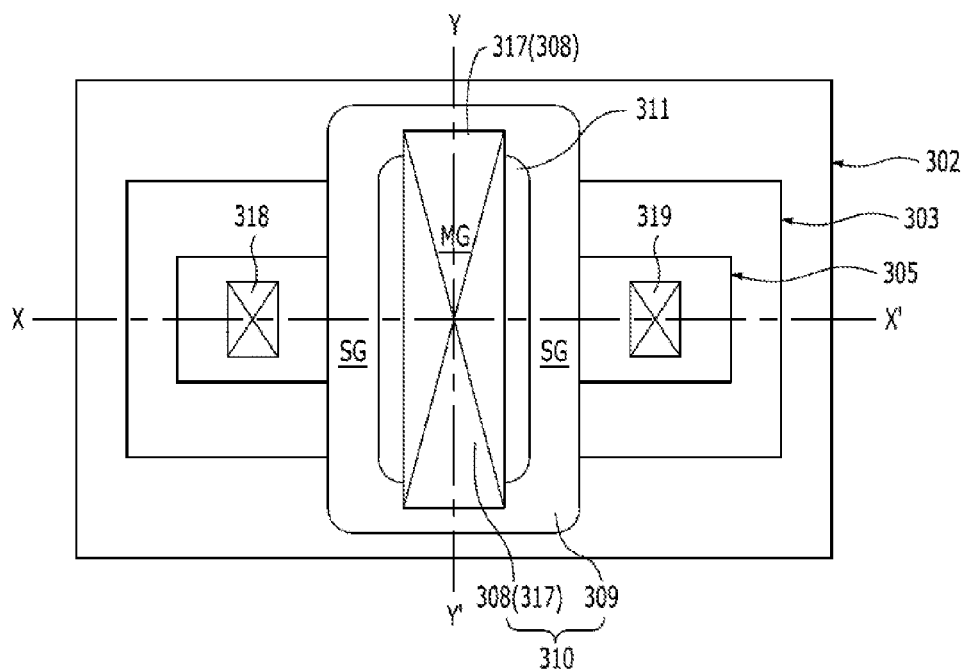
FIGS. 5A to 5C are views illustrating a nonvolatile memory device in accordance with a second embodiment.
Figure 5B:
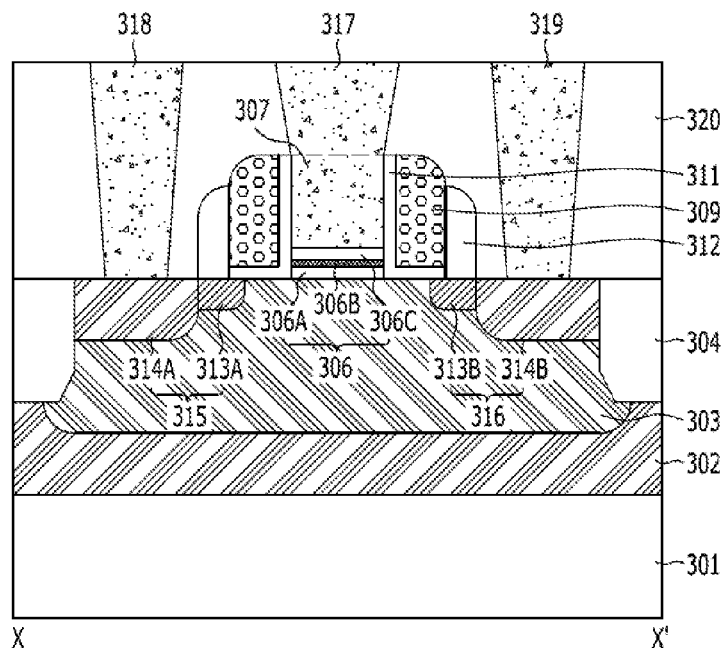
Figure 5C:
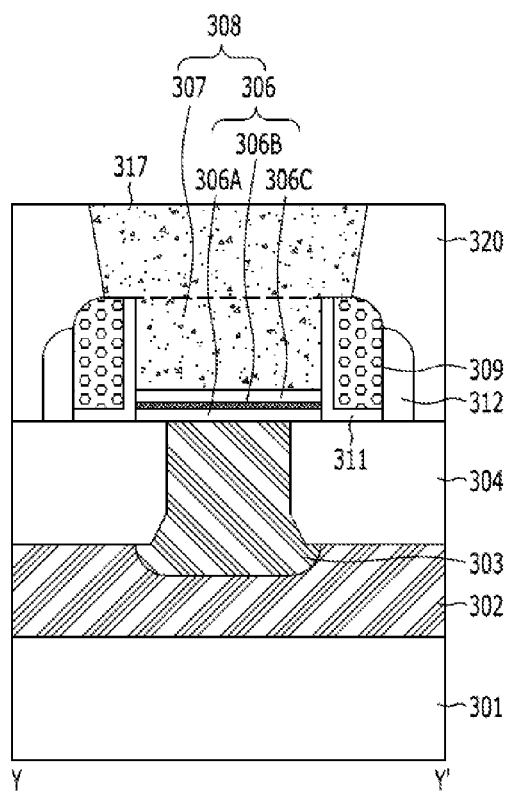

FIGS. 5A to 5C are views illustrating a nonvolatile memory device in accordance with a second embodiment. In detail, FIGS. 5A to 5C illustrate a unit cell of the nonvolatile memory device, wherein FIG. 5A is a plan view and FIGS. 5B and 5C are cross-sectional views taken along the lines X-X' and Y-Y' of FIG. 5A, respectively.

Referring to FIGS. 5A to 5C, a nonvolatile memory device in accordance with the second embodiment includes a memory gate (MG) 308 in which a memory layer 306 and a gate electrode 307 are stacked on a substrate 301, a select gate (SG) 309 which is formed on sidewalls of the memory gate 308, a source region 315 and a drain region 316 which are formed in the substrate 301 on first and second sides of a gate pattern 310. The gate pattern 310 includes the memory gate 308 and the select gate 309. A gate contact 317 electrically connects the memory gate 308 and the select gate 309 to each other and may be formed integrally with the gate electrode 307 of the memory gate 308. As used herein, the term "formed integrally" refers to structures that are formed as a unitary structure, e.g., by using the same deposition step to form two different structures.

A deep well 302 of the second conductivity type and an isolated well 303 (or shallow well) of the first conductivity type are formed in the substrate 301. In an embodiment, the isolated well 303 is formed within the deep well 302. The substrate 301 may be a semiconductor substrate. The semiconductor substrate may be in a single crystalline state, and may be material that includes silicon and in a poly crystalline state. In an embodiment, the semiconductor substrate may include monocrystalline silicon layer. For instance, the substrate 301 may be a bulk silicon substrate, or a silicon-on-insulator (SOI) substrate in which a supporting substrate, a buried dielectric layer and a monocrystalline silicon layer are sequentially stacked.

The deep well 302 and the isolated well 303 which are formed in the substrate 301 may be impurity regions which are respectively formed by implanting impurities of the second conductivity type and impurities of the first conductivity type, and provide an area in which a unit cell may operate. In an operation, bias (for example, a voltage) may be applied to the deep well 302 and the isolated well 303. Due to the bias applied to the deep well 302 and the isolated well 303, a magnitude of a bias applied to the gate pattern 310 during device operation may be reduced. Further, the deep well 302 and the isolated well 303 may decrease interference between adjacent unit cells.

An isolation structure 304 is formed in the substrate 301 in such a way as to define an active region 305. The active region 305 may be a bar type which has a major axis and a minor axis or a line type. The active region 305 may include a projection (not shown) which is formed at the end of the active region 305 in the direction of the major axis. The isolation structure 304 may be formed through a shallow trench isolation (STI) process. The isolation structure 304 may include a dielectric layer. With respect to the substrate 301, the bottom surface of the isolation structure 304 may be higher than the bottom surface of the isolated well 303. The bottom surface of the isolation structure 304 may be positioned between the bottom surface of the isolated well 303 and the bottom surface of the deep well 302.

The memory gate 308 in which the memory layer 306 and the gate electrode 307 are stacked is formed on the substrate 301. The memory layer 306 may be a stack layer in which a tunnel dielectric layer 306A is formed over the isolated well 303, a charge trap layer 306B is formed over the tunnel dielectric layer 306A and a charge blocking layer 306C is formed over the charge trap layer 306B. Each of the tunnel dielectric layer 306A, the charge trap layer 306B and the charge blocking layer 306C may include an oxide layer, a nitride layer, an oxynitride layer, or a stack layer thereof. For instance, each of the tunnel dielectric layer 306A and the charge blocking layer 306C may be an oxide layer, and the charge trap layer 306B may be a nitride layer. In an embodiment, the memory layer 306 may have an oxide-nitride-oxide (ONO) structure. The gate electrode 307 on the memory layer 306 serves as a control gate, and controls the trapping and ejection of charge carriers to and from the charge trap layer 306B of the memory layer 306. The gate electrode 307 may formed as a unitary structure with the gate contact 317, and may include conductive material containing silicon or metal, or both.

The select gate 309 is formed on sidewalls of the memory gate 308. The select gate 309 functions to prevent over-erase. In order to prevent the characteristics of the nonvolatile memory device from being degraded due to a variation in a channel length and a charge trap mismatch, the select gate 309 may have a shape which is formed on sidewalls of the memory gate 308. In detail, when viewed from above, the select gate 309 may have a shape which is formed on all sidewalls of the memory gate 308 and thus surrounds the memory gate 308. When viewed from a cross-sectional perspective such as the view of FIG. 5B, the select gate 309 may have a structure which is formed on both sidewalls of the memory gate 308, similar to spacers. Since the select gate 309 surrounds the memory gate 308 when viewed from above, cell uniformity may be improved. The select gate 309 may include a silicon or metal.

A gate dielectric layer 311 is provided between the select gate 309 and the substrate 301 and between the select gate 309 and the memory gate 308. Thus, the cross-section of gate dielectric layer 311 may have an 'L' sectional shape. A thickness of a portion of the gate dielectric layer 311 between the select gate 309 and the substrate 301 may be the same as or larger than the thickness of a portion of the gate dielectric layer 311 between the select gate 309 and the memory gate 308. The gate dielectric layer 311 may include an oxide layer, a nitride layer and an oxynitride layer, or a stack layer thereof.

A spacer 312 is formed on sidewalls of a gate pattern 310 including the memory gate 308 and the select gate 309. When viewed from above, the spacer 312 may have a shape which is formed on all sidewalls of the gate pattern 310 and thus surrounds the gate pattern 310, and, when viewed from a cross-sectional perspective such as the view of FIG. 5B, the spacer 312 may have a structure which is formed on first and second sidewalls of the gate pattern 310. The spacer 312 may include an oxide layer, a nitride layer, an oxynitride layer, or a stack layer thereof.

The source region 315 and the drain region 316 of the second conductivity type are formed in the substrate 301 on first and second sides of the gate pattern 310 including the memory gate 308 and the select gate 309. The source region 315 and the drain region 316 may be impurity regions which are formed by implanting impurities of the second conductivity type into the substrate 301, and may have LDD structures. In detail, the source region 315 and the drain region 316 may include first impurity regions 313A and 313B of the second conductivity type and second impurity regions 314A and 314B of the second conductivity type. The impurity doping concentration of the second impurity regions 314A and 314B may be greater than that of the first impurity regions 313A and 313B. Portions of the first impurity regions 313A and 313B may overlap with portions of the select gate 309, and the interface of the first impurity regions 313A and 313B and the second impurity regions 314A and 314B may be aligned with outer sidewalls of the spacer 312.

An interlayer dielectric layer 320 is formed over the surface of the substrate 301 to cover the gate pattern 310. The gate contact 317, a source contact 318 and a drain contact 319 are formed in the interlayer dielectric layer 320 to pass through the interlayer dielectric layer 320 and be connected with the gate pattern 310, the source region 315 and the drain region 316, respectively. The interlayer dielectric layer 320 may include an oxide layer, a nitride layer, an oxynitride layer, or a stack layer thereof.

The gate contact 317 may be formed as a unitary structure with the gate electrode 307 of the memory gate 308, and may have a structure which contacts the select gate 309. In an embodiment, gate contact 317 may be a contact plug which contacts the gate electrode 307 of the memory gate 308 and the select gate 309. In another embodiment, the gate contact 317 may be a bar type or a line type which contacts the gate electrode 307 of the memory gate 308 and the select gate 309 on at least two sides of the gate electrode 307. The memory gate 308 and the select gate 309 may be electrically connected to each other by the gate contact 317.

The gate contact 317 performs a function of connecting a conductive line (not shown) on the interlayer dielectric layer 320, for example, a word line, to the gate pattern 310. A bias applied through the word line may be simultaneously applied to the memory gate 308 and the select gate 309. The source contact 318 performs a function of connecting a conductive line (not shown) on the interlayer dielectric layer 320, for example, a source line, to the source region 315. The drain contact 319 performs a function of connecting a conductive line (not shown) on the interlayer dielectric layer 320, for example, a bit line, to the drain region 316.

Although not shown in the drawings, in an embodiment, an ohmic contact layer may be formed on the surface of the select gate 309, the surface of the source region 315 and the surface of the drain region 316. The ohmic contact layer reduces contact resistance, and may include a metal silicide.

Since a nonvolatile memory device with the above-described structure has the select gate 309, over-erase may be prevented. Through this, an additional operation such as recovery may not be required, so that a peripheral circuit for a recovery operation may not be needed. That is to say, by preventing over-erase, it is possible to improve the operation characteristics and the degree of integration of a nonvolatile memory device.

Also, in a nonvolatile memory device with the above-described structure, the memory gate 308 and the select gate 309 are disposed on the isolated well 303 and the select gate 309 is disposed on sides of the memory gate 308. Accordingly, an FN tunneling scheme may be used to program and erase the nonvolatile memory device. Therefore, problems caused in the conventional art due to the use of an HCI scheme, such as excessive power consumption, may be prevented.

In addition, in the a nonvolatile memory device with the above-described structure, since the select gate 309 is disposed on sides of the memory gate 308, it is possible to prevent the characteristics of a nonvolatile memory device from being degraded due to a variation in a channel length of a select gate and a charge trap mismatch.

Moreover, in a nonvolatile memory device with the above-described structure, since the select gate 309 is disposed on sides of the memory gate 308 and has a shape which surrounds the memory gate 308 when viewed from above, it is possible to improve cell uniformity.

Furthermore, in a nonvolatile memory device with the above-described structure, as the gate electrode 307 is formed as a unitary structure with the gate contact 317, material including metal may be used for the gate electrode 307, whereby an operation speed may be increased.

FIGS. 6A to 6H and 7A to 7H are views illustrating a method for fabricating a nonvolatile memory device in accordance with the second embodiment of the present invention. In detail, FIGS. 6A to 6H and 7A to 7H are cross-sectional views taken along the lines X-X' and Y-Y' of FIG. 5A, respectively, showing a method for fabricating a nonvolatile memory device.

Figure 6A:
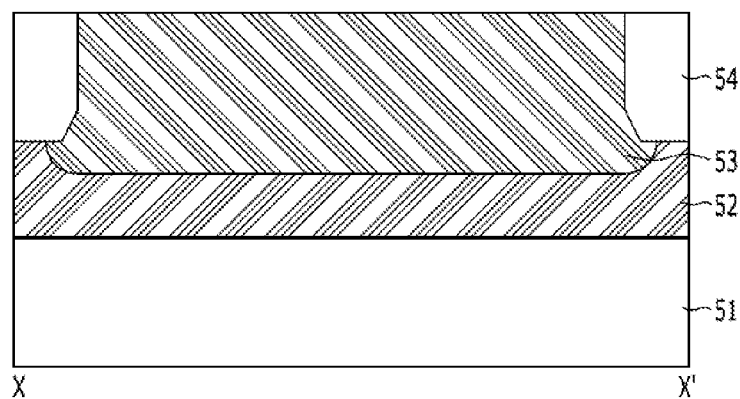
FIGS. 6A to 6H and 7A to 7H are views explaining a method for fabricating the nonvolatile memory device in accordance with the second embodiment.
Figure 7A:
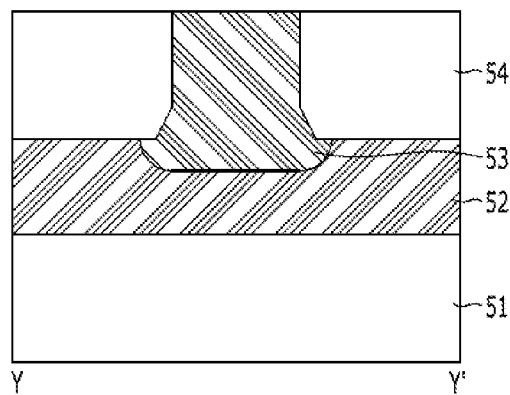

Referring to FIGS. 6A and 7A, a deep well 52 of the second conductivity type is formed in a substrate 51. A bulk silicon substrate or an SOI substrate may be used as the substrate 51. The deep well 52 may be formed by ion-implanting impurities of the second conductivity type (for example, N type impurities) into the substrate 51.

An isolation structure 54 is formed in the substrate 51 to define a plurality of active regions. The isolation structure 54 may be formed through an STI process. The STI process refers to a series of processes of defining trenches for isolation in the substrate 51 and filling a dielectric substance in the trenches, thereby forming an isolation structure. Each of the active regions defined by the isolation structure 54 may be a bar type or a line type which have a major axis and a minor axis. Each of the active regions defined by the isolation structure 54 may include a projection (not shown) which is formed at the end of the active region.

An isolated well 53 of the first conductivity type is formed in the substrate 51. The isolated well 53 may be formed in the deep well 52. The isolated well 53 may be formed such that the bottom surface of the isolated well 53 is positioned between the bottom surface of the isolation structure 54 and the bottom surface of the deep well 52. A plurality of isolated wells 53 may be formed in the deep well 52. Each of the isolated wells 53 may be isolated by the isolation structure 54 and junction isolation between the isolated well 53 and the deep well 52. The isolated well 53 may be formed by ion-implanting impurities of the first conductivity type (for example, P type impurities) into the deep well 52.

Figure 6B:
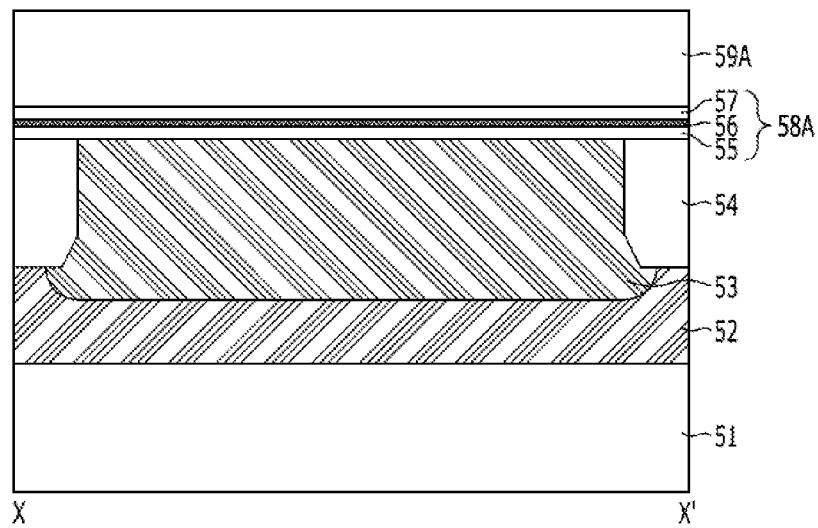
Figure 7B:
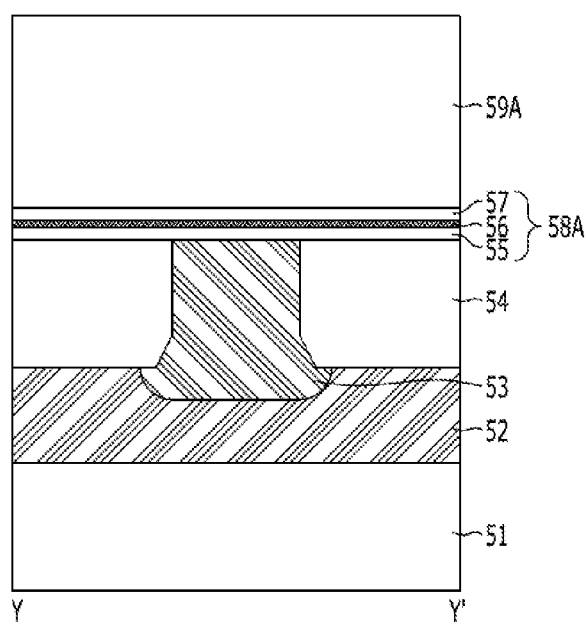

Referring to FIGS. 6B and 7B, a memory layer 58A in which a tunnel dielectric layer 55, a charge trap layer 56 and a charge blocking layer 57 are formed on the surface of the substrate 51. Each of the tunnel dielectric layer 55, the charge trap layer 56 and the charge blocking layer 57 may be formed of a dielectric layer. As the dielectric layer, an oxide layer, a nitride layer, or an oxynitride layer may be used. The memory layer 58A may be formed to have an oxide-nitride-oxide (ONO) structure.

In detail, the tunnel dielectric layer 55 may be formed as an oxide layer such as a silicon oxide layer. The silicon oxide layer may be formed through thermal oxidation. The charge trap layer 56 may be formed as a nitride layer such as a silicon nitride layer. The charge trap layer 56 may be formed through chemical vapor deposition (CVD) or atomic layer deposition (ALD). The charge blocking layer 57 may be formed of an oxide layer such as a metal oxide layer with a higher dielectric constant than a silicon oxide layer. The charge blocking layer 57 may be formed through CVD.

A sacrificial layer 59A is formed on the memory layer 58A. The sacrificial layer 59A may be formed using a substance which has an etch selectivity with respect to the memory layer 58A and a gate dielectric layer and an interlayer dielectric layer which will be formed through subsequent processes. For instance, the sacrificial layer 59A may be formed as a nitride layer.

Figure 6C:
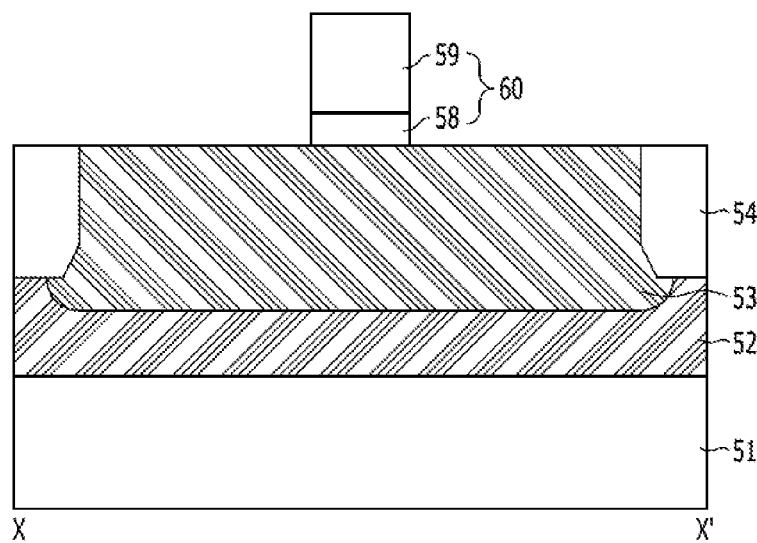
Figure 7C:
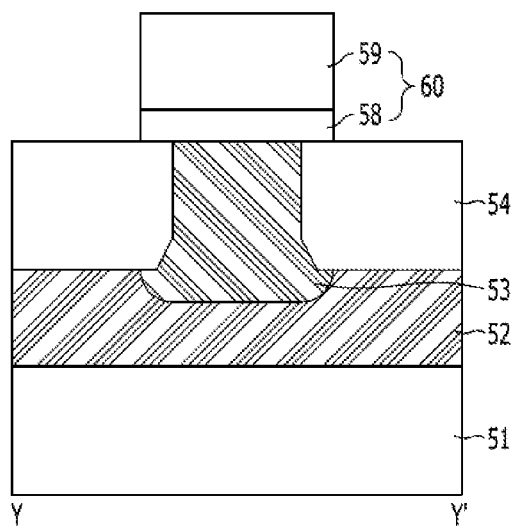

Referring to FIGS. 6C and 7C, after forming mask patterns (not shown) on the sacrificial layer 59A, the sacrificial layer 59A and the memory layer 58A are etched using the mask patterns as an etch mask. The etching may be performed as a dry etching process.

As a result, a first pattern 60 in which the memory layer 58 and the sacrificial layer 59 are stacked may be formed.

Figure 6D:
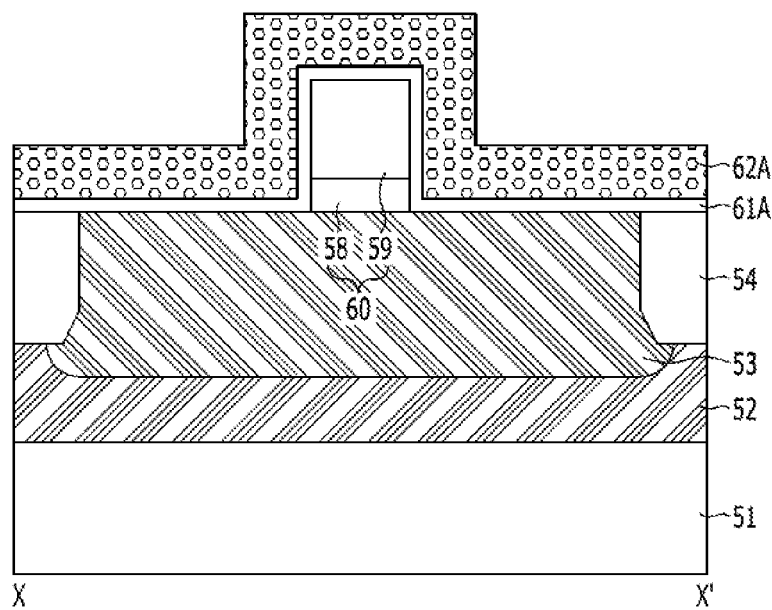
Figure 7D:
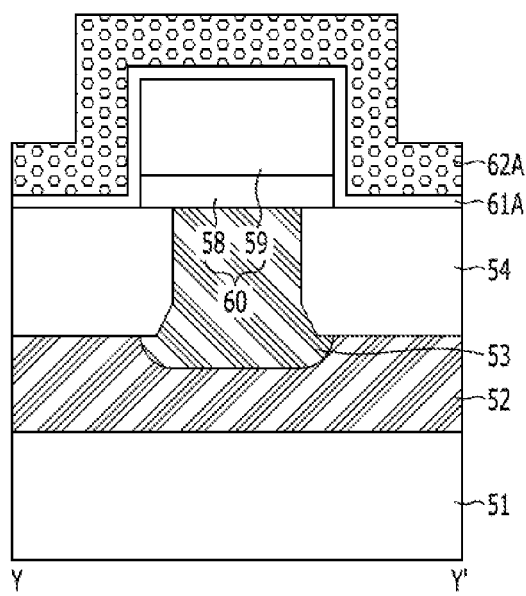

Referring to FIGS. 6D and 7D, a gate dielectric layer 61A is formed over the outer surface of the structure including the first pattern 60. The gate dielectric layer 61A may include an oxide layer, a nitride layer, or an oxynitride layer. For instance, the gate dielectric layer 61A may be formed of an oxide layer, and the oxide layer may be formed through an oxidation process or a deposition process. The oxidation process may include thermal oxidation, and the deposition process may include CVD, physical vapor deposition (PVD) or ALD.

A gate conductive layer 62A is formed on the gate dielectric layer 61A. The gate conductive layer 62A may be formed using material including silicon. For instance, the gate conductive layer 62A may be formed as a polysilicon layer. A thickness of the gate conductive layer 62A may be controlled to obtain a channel length of a select gate that is of a desired dimension.

Figure 6E:
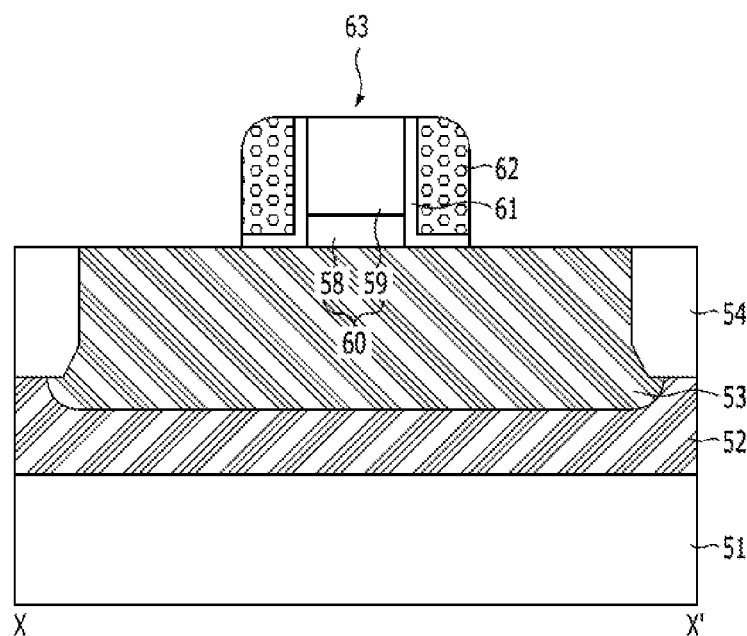
Figure 7E:
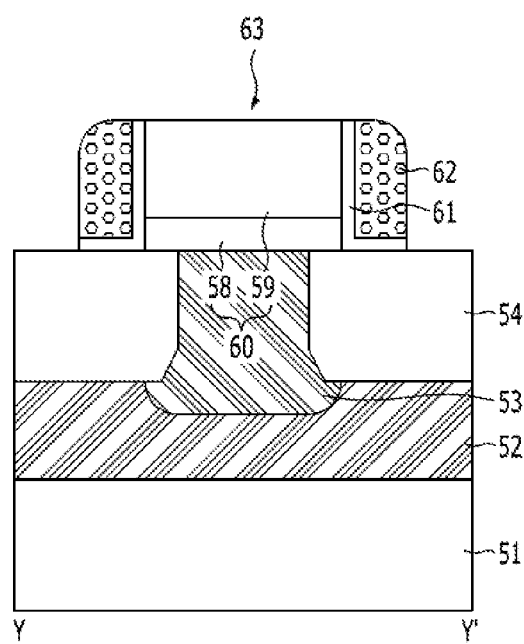

Referring to FIGS. 6E and 7E, by performing a blanket etching process on the gate conductive layer 62A and the gate dielectric layer 61A, a select gate 62 is formed. The blanket etching process may be performed as an etch-back process. A gate dielectric layer 61 may have a shape which is provided between the select gate 62 and the first pattern 60 and between the select gate 62 and the substrate 51. The select gate 62 is formed on sidewalls of the first pattern 60 and may have a spacer shape. Relative to a patterning process using photolithography and etching, because the select gate 62 is formed through the blanket etching process, variation in the channel length of the select gate 62 may be decreased, so that cell uniformity may be improved.

Accordingly, a second pattern 63 which includes the first pattern 60 and the select gate 62 formed on sidewalls of the first pattern 60 may be formed.

Figure 6F:
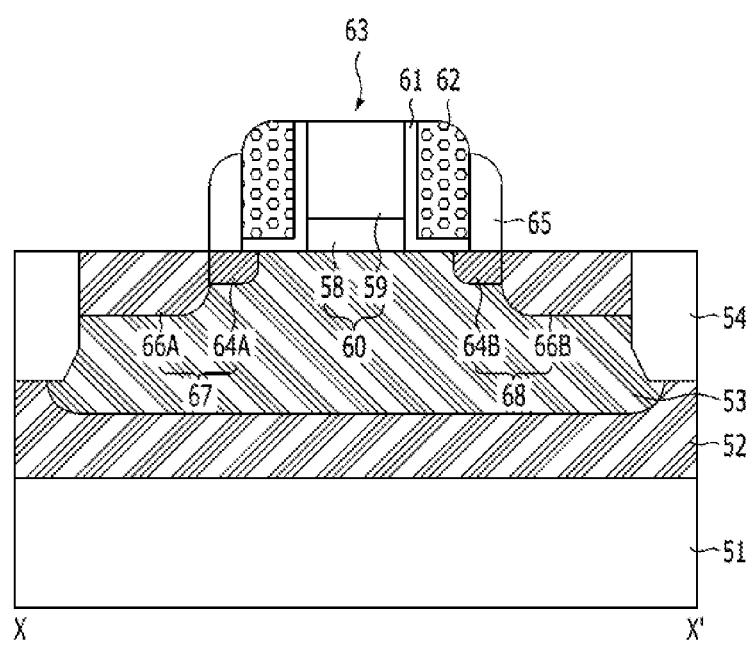
Figure 7F:
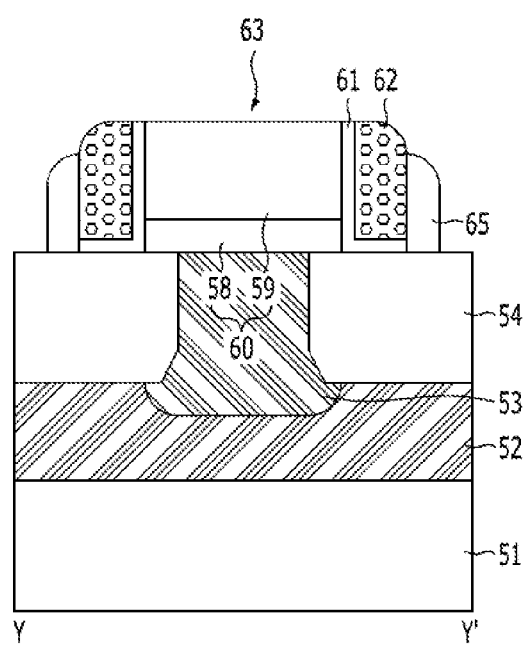

Referring to FIGS. 6F and 7F, first impurity regions 64A and 64B of the second conductivity type are formed in the substrate 51 on first and second sides of the second pattern 63. As seen in FIG. 6F, the first impurity regions 64A and 64B may be formed by implanting impurities of the second conductivity type into the substrate 51 on the first and second sides of the second pattern 63.

A spacer 65 is formed on sidewalls of the second pattern 63. In other words, the spacer 65 is formed on sidewalls of the select gate 62. The spacer 65 may include an oxide layer, a nitride layer, an oxynitride layer, or a stack layer thereof.

As seen in FIG. 6F, second impurity regions 66A and 66B of the second conductivity type are formed in the substrate 51 on first and second sides of the second pattern 63 including the spacer 65. The second impurity regions 66A and 66B may be formed by implanting impurities of the second conductivity type into the substrate 51 on both sides of the second pattern 63, and may be formed to have an impurity doping concentration greater than that of the first impurity regions 64A and 64B.

Accordingly, a source region 67 and a drain region 68 with LDD structures including the first impurity regions 64A and 64B and the second impurity regions 66A and 66B may be formed in the substrate 51 on first and second sides of the second pattern 63.

Figure 6G:
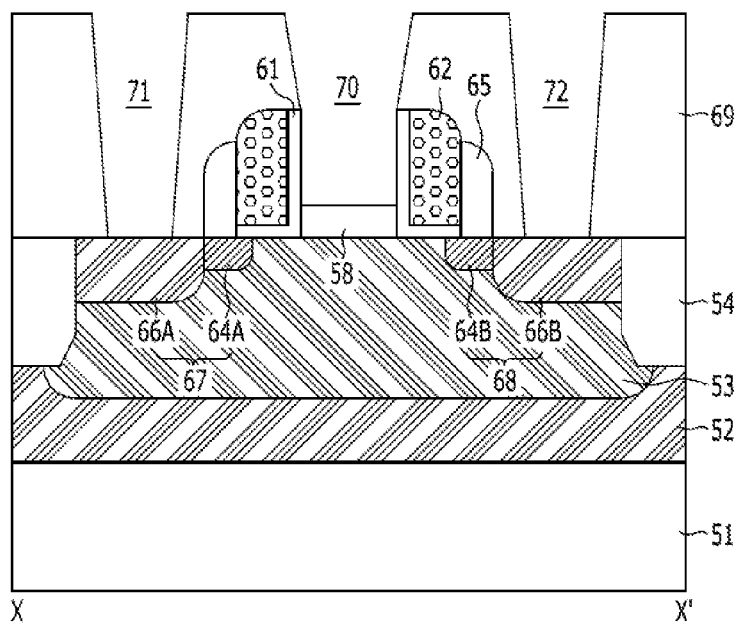
Figure 7G:
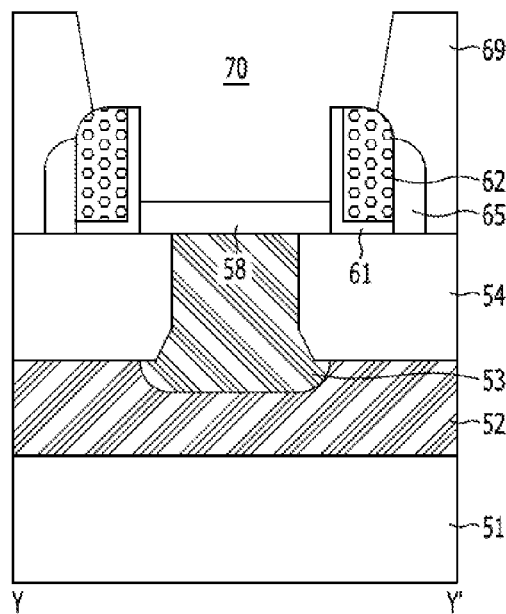

Referring to FIGS. 6G and 7G, an interlayer dielectric layer 69 is formed on the substrate 51 to cover the second pattern 63. The interlayer dielectric layer 69 may include an oxide layer, a nitride layer, an oxynitride layer, or a stack layer thereof.

In an embodiment, although not shown in a drawing, before forming the interlayer dielectric layer 69, an ohmic contact layer may be formed on any of the surface of the select gate 62, the surface of the source region 67 and the surface of the drain region 68. The ohmic contact layer may be formed using a metal silicide. The ohmic contact layer may be formed through a series of processes of forming a metal layer such as a cobalt layer or a titanium layer on the entire surface of the substrate 51 and then sequentially performing annealing and cleaning for removing unreacted portions of the metal layer.

By selectively etching the interlayer dielectric layer 69, a gate contact hole 70 exposing the second pattern 63, a source contact hole 71 exposing the source region 67 and a drain contact hole 72 exposing the drain region 68 are defined. The gate contact hole 70 may be defined as a hole type (or contact hole) which exposes the sacrificial layer 59 and the select gate 62, or a bar type or a line type which exposes the sacrificial layer 59 and the select gate 62 on two sides of the sacrificial layer 59. The source contact hole 71 and the drain contact hole 72 may be hole types.

In an embodiment, the sacrificial layer 59 exposed by the gate contact hole 70 is removed, which also enlarges the gate contact hole 70. The sacrificial layer 59 may be removed using wet etching to avoid damage to the already formed structure. For instance, in an embodiment in which the sacrificial layer 59 is formed as a nitride layer, the sacrificial layer 59 may be removed using a phosphoric acid solution.

Figure 6H:
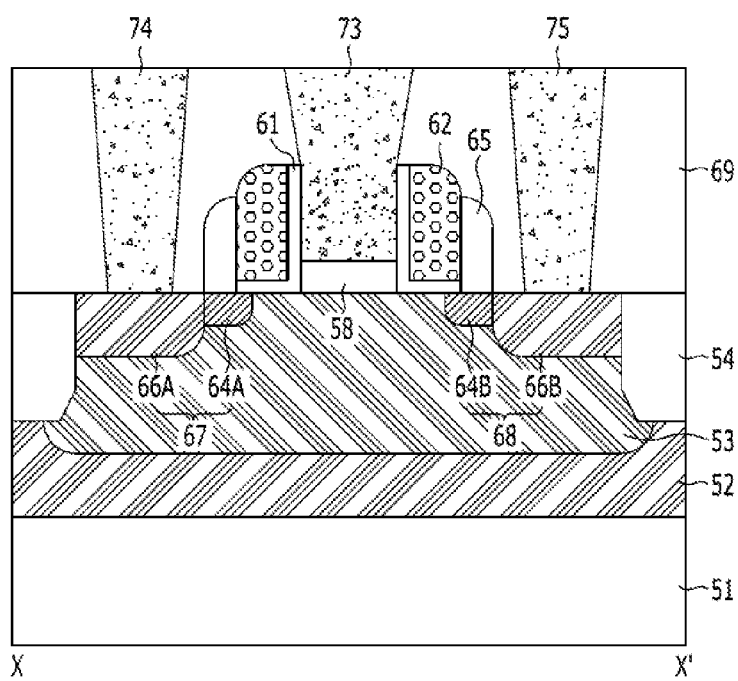
Figure 7H:
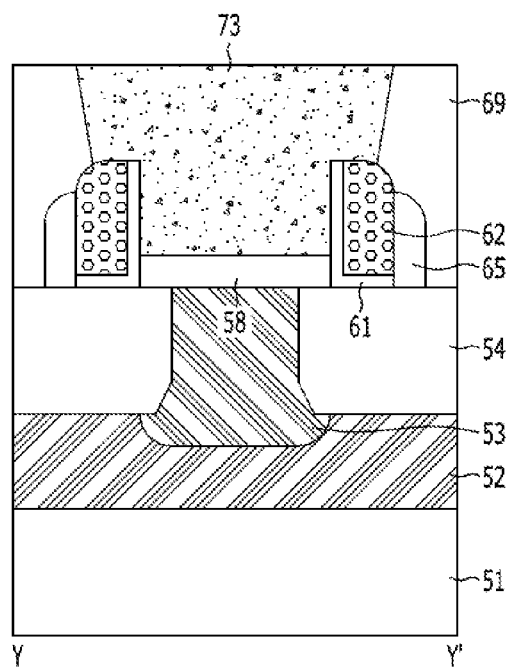

Referring to FIGS. 6H and 7H, conductive material is formed over the surface of the substrate 51 to fill the gate contact hole 70, the source contact hole 71 and the drain contact hole 72. The conductive material is removed or planarized until the interlayer dielectric layer 69 is exposed, thereby forming a gate contact 73, a source contact 74 and a drain contact 75 are formed. As the gate contact 73 fills a space which was created by removing the sacrificial layer 59, the gate contact 73 not only serves as a gate electrode of a memory gate, but also serves as a contact plug connecting the memory gate with the select gate 62. That is, the gate contact 73 and the gate electrode of the memory gate are formed as a unitary structure or integrally formed. The conductive material used may be material including silicon or metal, or both.

Although not shown in the drawings, a word line which is in contact with the gate contact 73, a source line which is in contact with the source contact 74, and a bit line which is in contact with the drain contact 75, are formed on the interlayer dielectric layer 69.

Since the nonvolatile memory device formed through the above-described processes has the select gate 62, over-erase may be prevented. Accordingly, an additional operation such as recovery may not be required, so that a peripheral circuit for a recovery operation may not be needed. That is to say, by preventing over-erase, it is possible to improve the operation characteristics and the degree of integration of a nonvolatile memory device.

Also, in a nonvolatile memory device formed through the above-described processes, when the memory gate including the gate electrode integrated with the gate contact 73 and the memory layer 58 and the select gate 62 are disposed on the isolated well 53 and the select gate 62 is disposed on sides of the memory gate, an FN tunneling scheme may be used in a program operation and an erase operation. Therefore, problems caused in the conventional art due to the use of an HCI scheme, such as excessive power consumption, may be prevented.

Further, in a nonvolatile memory device formed through the above-described processes, when the select gate 62 is formed on sides of the memory gate through the blanket etching process, it is possible to prevent characteristics of a nonvolatile memory device from being degraded due to a variation in the channel length of a select gate and a charge trap mismatch, and it is possible to improve cell uniformity.

A cell array having a unit cell of a nonvolatile memory device in accordance with an embodiment will now be described. For the sake of convenience in explanation, the unit cell shown in FIGS. 2A to 2C is used to describe embodiments of a cell array. However, embodiments are not limited thereto. The same reference numerals will be used to refer to the same components, and detailed descriptions thereof may be omitted for the sake of brevity.

Figure 8B:
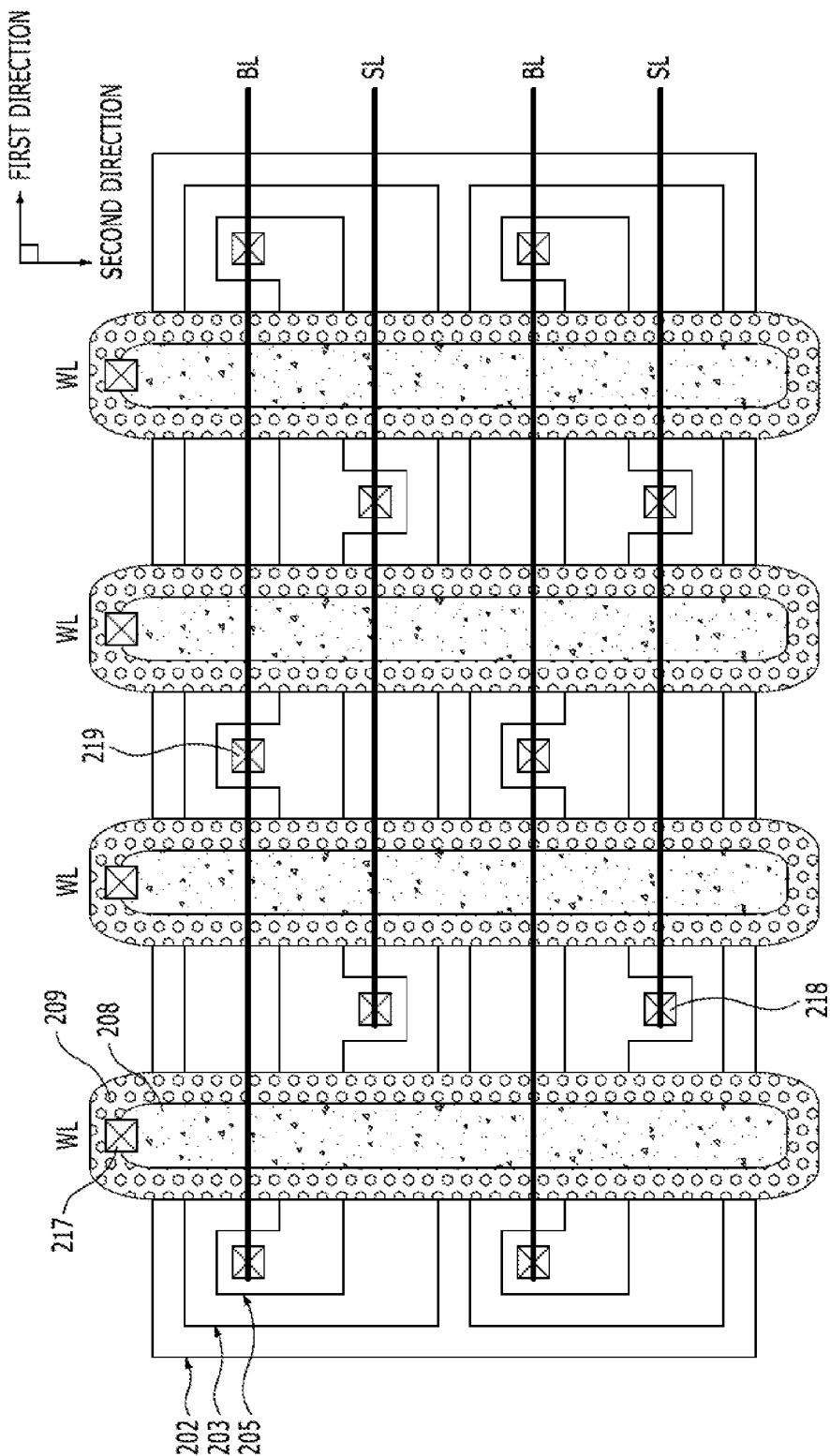

FIG. 8A is a plan view illustrating a cell array of the nonvolatile memory device in accordance with an embodiment, and FIG. 8B is a plan view illustrating another embodiment of the cell array.

Referring to FIGS. 8A and 8B, a cell array includes a substrate 201 which has a plurality of active regions 205, memory gates 208 which are formed on the substrate 201 and in each of which a memory layer 206 and a gate electrode 207 are stacked, select gates 209 which are formed on first and second sidewalls of the memory gates 208, gate contacts 217 which connect gate electrodes 207 to the select gates 209, and a plurality of word lines WL (not shown) which extends across the active regions 205. The word lines are coupled to memory gates 208, and select gates 209 through gate contacts 217. Source regions 215 of the second conductivity type and drain regions 216 of the second conductivity type are formed in the substrate 201 on sides of the word lines WL. The cell array further includes a plurality of bit lines BL which are connected to the drain regions 216 through a plurality of drain contacts 219, and a plurality of source lines SL which are connected to the source regions 215 through a plurality of source contacts 218. In addition, the cell array may include isolated wells 203 of the first conductivity type which are formed in the substrate 201 corresponding to respective active regions 205, and deep wells 202 of the second conductivity type which are formed in the substrate 201 and below the isolated wells 203. In accordance with the structures of the isolated wells 203 and the deep wells 202 and a method of applying bias thereto, an erase operation may be performed by the unit of a byte or by the unit of a page.

The active regions 205 and the isolated wells 203 corresponding to the active regions 205 may be line types which extend in a first direction, and may be separated from one another by a predetermined distance in the second direction. Depending on the layout of the bit lines BL or the source lines SL, the active regions 205 may or may not include protruded upper surfaces.

The word lines WL may be line types which extend in the second direction, and may be separated from one another by a predetermined distance in the first direction. The source regions 215 and the drain regions 216 are formed between the word lines WL in the first direction. The source regions 215 and the drain regions 216 may be alternately disposed or may be disposed such that adjacent word lines WL share the source regions 215.

Each memory gate 208 may have a structure in which the memory layer 206 and the gate electrode 207 are stacked. The memory layer 206 may be a stack layer in which a tunnel dielectric layer 206A, a charge trap layer 206B and a charge blocking layer 206C are sequentially stacked. The gate electrode 207 may be formed as a unitary structure with the gate contact 217. The memory gate 208 may be a line type pattern which extends in the second direction and may have a shape which crosses a plurality of active regions 205.

The select gate 209 is formed on sidewalls of the memory gate 208. In order to prevent characteristics of the nonvolatile memory device from being degraded due to a variation in a channel length and a charge trap mismatch, the select gate 209 may have a shape which is formed on sidewalls of the memory gate 208. In detail, when viewed from above, the select gate 209 may have a shape which is formed on all sidewalls of the memory gate 208 and thus surrounds the memory gate 208, and, when viewed from a cross-sectional perspective such as the view of FIG. 2B, the select gate 209 may have a structure which is formed on both sidewalls of the memory gate 208 like spacers. Since the select gate 209 has the shape which surrounds the memory gate 208 when viewed from above, cell uniformity may be improved.

In an embodiment, the gate contact 217 may be a contact plug which contacts the gate electrode 207 of the memory gate 208 and the select gate 209. In another embodiment, the gate contact 217 may be a bar type or a line type which contacts the gate electrode 207 of the memory gate 208 and the select gate 209 on two sides of the gate electrode 207. The memory gate 208 and the select gate 209 may be electrically connected with each other by the gate contact 217.

Since the nonvolatile memory device with the above-described structure has the select gate 209, over-erase may be prevented. Accordingly, an additional operation such as recovery may not be required, and a peripheral circuit for a recovery operation may not be needed. That is to say, by preventing over-erase, it is possible to improve operation characteristics and the degree of integration of a nonvolatile memory device.

Also, in a nonvolatile memory device with the above-described structure, when the memory gate 208 and the select gate 209 are disposed on the isolated well 203 and the select gate 209 is disposed on sides of the memory gate 208, an FN tunneling scheme may be used in a program operation and an erase operation. Therefore, problems caused in the conventional art due to the use of an HCI scheme, such as excessive power consumption, may be prevented.

Further, in a nonvolatile memory device with the above-described structure, when the select gate 209 is disposed on both lengthwise sides of the memory gate 208, it is possible to prevent characteristics of a nonvolatile memory device from being degraded due to a variation in the channel length of a select gate and a charge trap mismatch.

Moreover, in a nonvolatile memory device with the above-described structure, since the select gate 209 is disposed on sides of the memory gate 208 and has a shape which surrounds the memory gate 208 when viewed from above, it is possible to improve the uniformity of a plurality of unit cells. Through this, since a magnitude of bias (for example, the magnitude of a voltage) necessary for an operation may be decreased, it is possible to reduce the size of a peripheral circuit such as a pumping circuit, or the like.

Figure 9:
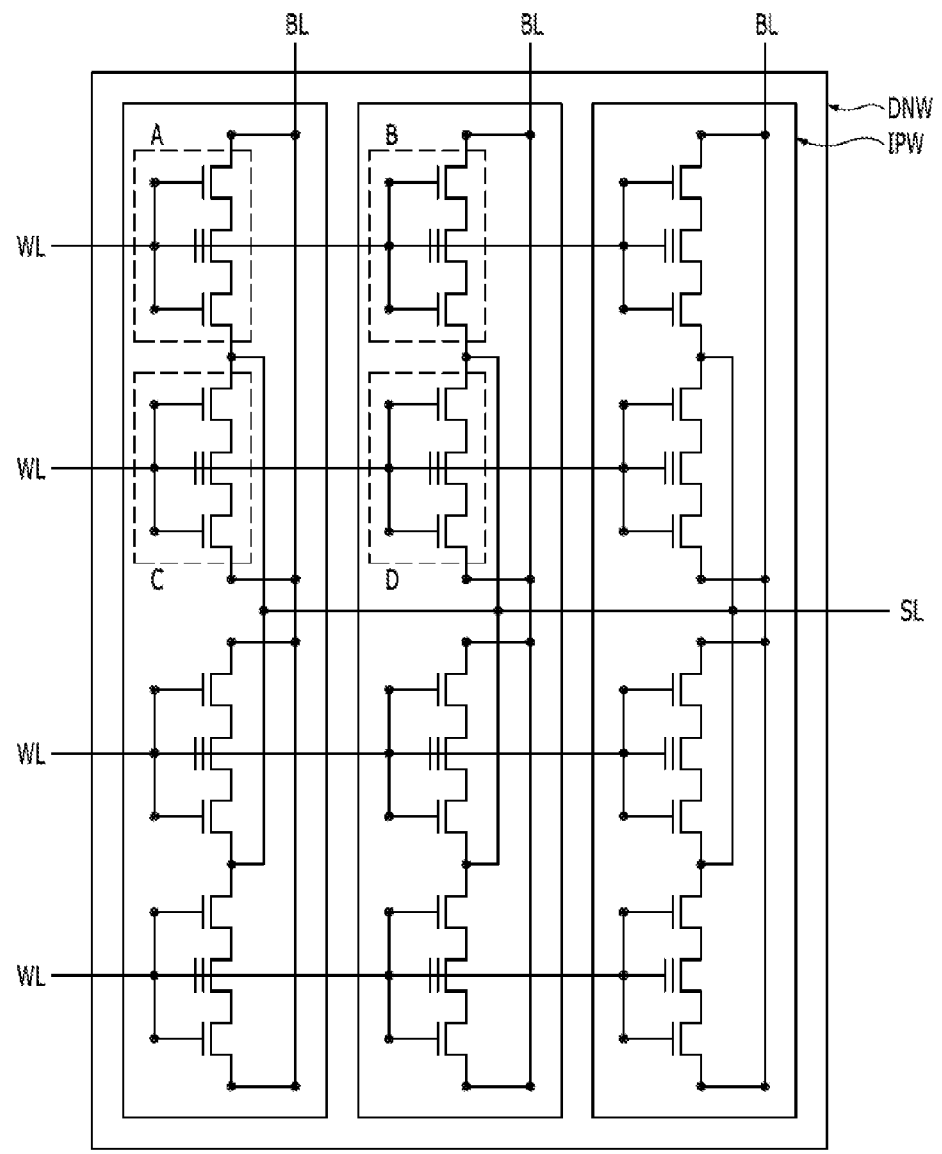
FIG. 9 is a circuit diagram of the nonvolatile memory device in accordance with embodiments.

Hereafter, a program operation, an erase operation and a read operation will be described with reference to FIG. 9 which schematically shows a circuit diagram for the cell arrays shown in FIGS. 8A and 8B and Table 1 which shows cell array operating conditions of the nonvolatile memory device in accordance with an embodiment. For reference, in Table 1, IPW refers to an isolated well doped with a P conductivity type dopant, and DNW means a deep well doped with an N conductivity type dopant.

TABLE 1

| Operation | | Program | Erase | Read |
|---|---|---|---|---|
| Scheme | | FN tunneling | FN tunneling | Forward |
| Minimum operation unit | | Bit | Page, Byte, Bit | Random access |
| Selected cell (A) | Word line (WL) | VPP | GND | VCC |
| | Source line (SL) | Floating | Floating | GND |
| | Bit line (BL) | Floating | Floating | Vread |
| | Isolated well (IPW) | GND | VPP | GND |
| | Deep well (DNW) | GND | VPP | GND |
| Unselected cell (B) sharing word line | Word line (WL) | VPP | GND | VCC |
| | Source line (SL) | Floating | Floating | GND |
| | Bit line (BL) | Floating | Floating | GND |
| | Isolated well (IPW) | ½VPP or GND | GND | GND |
| | Deep well (DNW) | ½VPP or GND | GND | GND |
| Unselected cell (C) sharing bit line | Word line (WL) | GND | GND or ½VPP | GND |
| | Source line (SL) | Floating | Floating | GND |
| | Bit line (BL) | Floating | Floating | Vread |
| | Isolated well (IPW) | GND | VPP | GND |
| | Deep well (DNW) | GND | VPP | GND |
| Unselected cell (D) | Word line (WL) | GND | GND or ½VPP | GND |
| | Source line (SL) | Floating | Floating | GND |
| | Bit line (BL) | Floating | Floating | GND |
| | Isolated well (IPW) | ½VPP or GND | GND | GND |
| | Deep well (DNW) | ½VPP or GND | GND | GND |

First, a program operation may use FN tunneling. In an embodiment, programming is performed on a cell unit basis or only on a selected memory cell, that is, by the unit of a bit. In detail, a selected cell A may be programmed by floating a source line and a bit line and applying a program voltage, for example, a pumping voltage VPP, to a word line (that is, a select gate and a memory gate) of the selected cell A. In the program operation, a ground voltage GND or a voltage (for example, ½ VPP) smaller than the pumping voltage VPP may be applied to an isolated well and a deep well of an unselected cell B which shares the word line. Because the voltage smaller than the pumping voltage VPP is applied to the isolated well and the deep well of the unselected cell B, unintended programming of the memory cell B may be prevented.

An erase operation may use FN tunneling. Erasing maybe performed on the basis of the unit of a page, the unit of a byte, or the unit of a bit. In detail, a selected cell A may be erased by floating a source line and a bit line and applying an erase voltage, for example, a pumping voltage VPP, to an isolated well and a deep well in order to create a sufficient potential difference between the charge trap layer and the isolated well to eject the charge carriers trapped in the charge trap layer into the isolated well. In the erase operation, a ground voltage GND or a voltage (for example, ½ VPP) smaller than the pumping voltage VPP may be applied to the word line of unselected cells C and D which do not share the word line with the selected cells A, B. The voltage (e.g., ½ VPP) applied to the unselected cells C and D is not big enough to cause the charge carriers to be ejected from the charge trap layers of the unselected cells C and D.

A read operation may use forward read in which reading is performed through charge migration in the same direction as the migrating direction of charges in the program operation. In detail, a selected cell A may be read by applying a voltage between the threshold voltage of a programmed cell and the threshold voltage of an erase cell, for example, a power supply voltage VCC, to the word line of the selected cell A and respectively applying a ground voltage GND and a read voltage Vread to a source line and a bit line. In the read operation, because the ground voltage GND is applied to the source line and the bit line of an unselected cell B which shares the word line and the ground voltage GND is applied to the word lines of an unselected cell C which shares the bit line and an unselected cell D, the unselected cells cannot be read.

Figure 10:
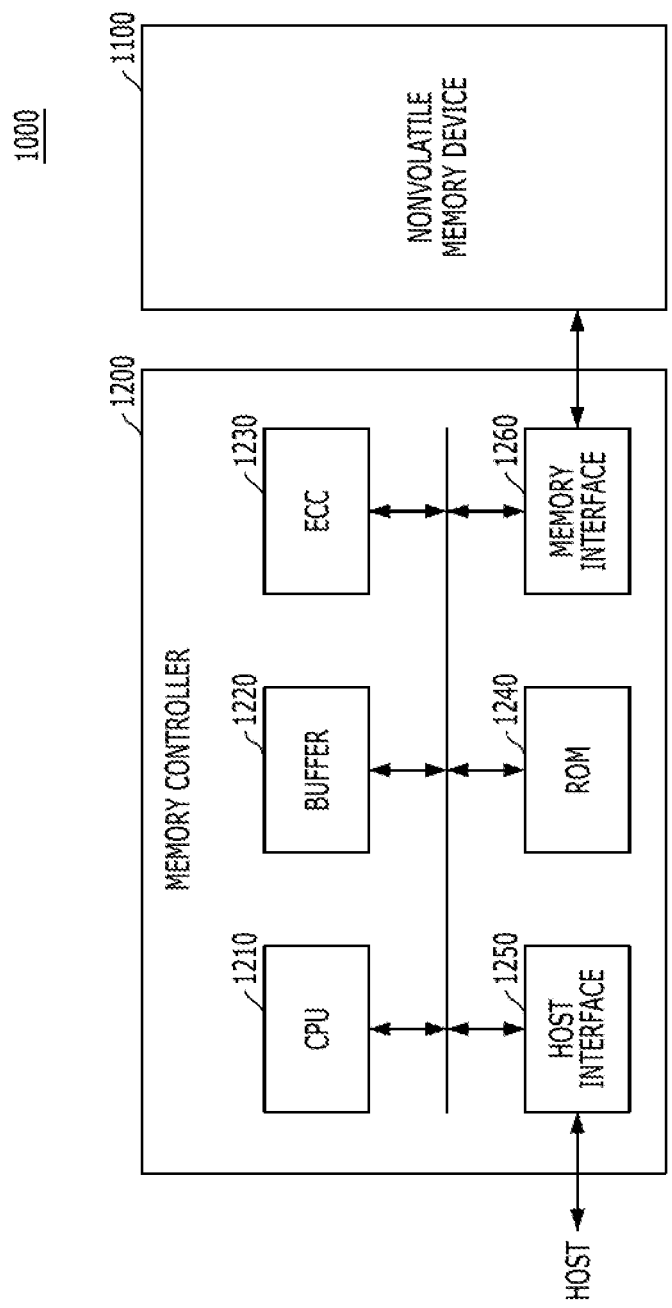
FIG. 10 is a block diagram showing a memory system including the nonvolatile memory device in accordance with embodiments.

FIG. 10 is a block diagram showing a memory system including a nonvolatile memory device in accordance with an embodiment.

Referring to FIG. 10, a memory system 1000 may include a nonvolatile memory device 1100, and a memory controller 1200 configured to control general data exchange between a host HOST and the nonvolatile memory device 1100. The nonvolatile memory device 1100 is realized by employing the unit cell, the cell array, and the operating method of the nonvolatile memory device in accordance with an embodiment. The memory controller 1200 may include a CPU 1210, a buffer 1220, an ECC circuit 1230, a ROM 1240, a host interface 1250, and a memory interface 1260.

The memory system 1000 may include a personal digital assistant (PDA), a portable computer, a tablet, a mobile phone, a digital music player, a memory card, electronic products capable of transmitting and/or receiving information in a wireless environment, a solid state disk, a camera image sensor, and an application chipset.

The nonvolatile memory device in accordance with an embodiment and an application device including the same may be provided as various types of packages. For example, the nonvolatile memory device and the application device including the same may be packaged and mounted using a various packaging methods such as package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat package (MQFP), a small outline (SOIC), a shrink small outline package (SSOP), a thin small outline package (TSOP), a thin quad flat package (TQFP), a system in package (SIP), a multi-chip package (MCP), a wafer-level fabricated package (WFP), a wafer-level processed stack package (WSP), wafer-level chip scale packages (WLCSPs), etc.

As is apparent from the above descriptions, in an embodiment, since a nonvolatile memory device has a select gate, over-erase may be prevented. Furthermore, because over-erase is prevented, an additional operation such as recovery may not be required, so that a peripheral circuit for a recovery operation may not be needed. Therefore, it is possible to improve operation characteristics and the degree of integration of a nonvolatile memory device.

Also, in an embodiment, because a Fowler-Nordheim (FN) tunneling scheme may be used in a program operation and an erase operation, problems caused in the conventional art due to the use of a hot carrier injection (HCI) scheme such as excessive power consumption may be prevented.

Further, in embodiments, when a select gate is disposed on opposing sides of a memory gate, it is possible to prevent characteristics of a nonvolatile memory device from being degraded due to a variation in the channel length of a select gate and a charge trap mismatch.

Moreover, in embodiments, since the select gate has a shape which surrounds a memory gate when viewed from above, it is possible to improve cell uniformity.

Although various embodiments have been described for illustrative purposes, it will be apparent to those skilled in the art that various changes and modifications may be made without departing from the spirit and scope of the following claims.

What is claimed is:

1. A nonvolatile memory device comprising:
   a memory gate including a memory layer provided over a substrate and a gate electrode provided over the memory layer, the memory gate having first and second opposing sidewalls disposed on first and second sides of the memory gate, respectively;
   first and second select gates disposed on the first and second sidewalls of the memory gate;
   a source region formed in the substrate proximate to the first side of the memory gate;
   a drain region formed in the substrate proximate to the second side of the memory gate; and
   a gate contact electrically coupled to the gate electrode of the memory gate and to the first select gate, or the second select gate, or both.

2. The nonvolatile memory device according to claim 1, wherein the gate contact forms a unitary structure with the gate electrode and includes the same conductive material.

3. The nonvolatile memory device according to claim 1, wherein the first and second select gates are joined to each other at least one end.

4. The nonvolatile memory device according to claim 3, wherein the gate contact is a bar type contact or a line type contact, and the gate contact contacts the gate electrode and the select gate on at least two sides of the gate electrode.

5. The nonvolatile memory device according to claim 1, wherein the gate contact is a contact plug disposed at one end portion of the memory gate, and wherein the first and second select gates extend around the sidewalls of the memory gate are joined to each other at two ends.

6. The nonvolatile memory device according to claim 1, further comprising:
   an interlayer dielectric layer formed over the substrate,
   wherein the gate contact passes through the interlayer dielectric layer.

7. The nonvolatile memory device according to claim 1, wherein the memory layer includes a tunnel dielectric layer, a charge trap layer provided over the tunnel dielectric layer and a charge blocking layer provided over the tunnel dielectric layer.

8. The nonvolatile memory device according to claim 7, wherein the memory gate is configured to be programmed and erased using a Fowler-Nordheim (FN) tunneling scheme, and
   wherein the charge trap layer is a dielectric layer.

9. A nonvolatile memory device comprising:
   a substrate having a plurality of active regions, the active regions extending along a first direction;
   a plurality of memory gates, each including a memory layer and a gate electrode which are stacked over the substrate;
   a plurality of select gates, each formed on at least two opposing sidewalls of one of the memory gates;
   a plurality of gate contacts, each electrically coupling one of the gate electrodes with a corresponding one of the select gates;
   a plurality of word lines, each extending along a second direction different from the first direction;
   a plurality of source regions, each formed in the substrate proximate to a first side of the memory gates;
   a plurality of drain regions, each formed in the substrate proximate to a second side of the memory gates;
   a plurality of bit lines extending along the first direction, each of the bit lines being connected to one of the drain regions; and
   a plurality of source lines, each of the source lines being connected to one of the source regions.

10. The nonvolatile memory device according to claim 9, further comprising:
    a deep well formed in the substrate; and
    a plurality of isolated wells formed within the deep well, each isolated well defining one of the active regions.

11. The nonvolatile memory device according to claim 9, wherein two neighboring word lines share the same source region.

12. The nonvolatile memory device according to claim 9, wherein each the gate contact is formed as part of a unitary structure with one of the gate electrodes.

13. The nonvolatile memory device according to claim 9, wherein each of the select gates surrounds one of the memory gates.

14. The nonvolatile memory device according to claim 9, wherein each gate contact is a hole type contact formed at one end portion of each memory gate and contacts a select gate and a gate electrode.

15. The nonvolatile memory device according to claim 9, wherein each gate contact is a bar type or a line type which contacts a gate electrode and a select gate on two sides of the gate electrode.

16. The nonvolatile memory device according to claim 9, wherein the memory gate is programmed and erased using a Fowler-Nordheim (FN) tunneling scheme.

17. A nonvolatile memory device, comprising:
    a substrate;

a first well provided in the substrate; and
a plurality of memory cells provided on the first well, each memory cell including:
a memory gate including a memory layer and a gate electrode provided over the memory layer, the memory gate having first and second opposing sidewalls;
first and second select gates disposed on the first and second sidewalls of the memory gate;
a source region formed in the substrate proximate to the first side of the memory gate;
a drain region formed in the substrate proximate to the second side of the memory gate; and
a gate contact electrically coupled to the memory gate and at least one of the first and second select gates.

18. The nonvolatile memory device of claim 17, further comprising:
a second well wherein the first well is defined therein,
wherein the memory layer includes a tunnel dielectric layer, a charge trap layer and a charge blocking layer.

19. The nonvolatile memory device of claim 18, wherein the charge trap layer is a dielectric layer.

20. The nonvolatile memory device of claim 18, wherein the first and second select gates are part of a continuous gate structure that wraps around the memory gate.

* * * * *